United States Patent
Notani et al.

(10) Patent No.: US 7,622,930 B2
(45) Date of Patent: Nov. 24, 2009

(54) METHOD FOR INSPECTING TRANSMISSION LINE CHARACTERISTIC OF A SEMICONDUCTOR DEVICE USING SIGNAL REFLECTION MEASUREMENT

(75) Inventors: Yoshihiro Notani, Tokyo (JP); Hitoshi Kurusu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 112 days.

(21) Appl. No.: 11/866,452

(22) Filed: Oct. 3, 2007

(65) Prior Publication Data
US 2008/0246554 A1 Oct. 9, 2008

(30) Foreign Application Priority Data
Apr. 5, 2007 (JP) ............................. 2007-099380

(51) Int. Cl.
*G01R 31/11* (2006.01)
(52) U.S. Cl. .................. 324/533; 324/642; 257/48; 257/506
(58) Field of Classification Search ................ None
See application file for complete search history.

(56) References Cited

U.S. PATENT DOCUMENTS 4,908,576 A * 3/1990 Jackson ................ 714/726
6,555,907 B2 4/2003 Katoh
7,106,146 B2 * 9/2006 Tsukahara et al. ......... 333/104

FOREIGN PATENT DOCUMENTS

| JP | 11-186803 A | 7/1999 |
|---|---|---|
| JP | 2000-188501 A | 7/2000 |
| JP | 2002-33602 A | 1/2002 |
| JP | 2002-237574 A | 8/2002 |

* cited by examiner

*Primary Examiner*—Paresh Patel
(74) *Attorney, Agent, or Firm*—Leydig, Voit & Mayer, Ltd.

(57) ABSTRACT

A method for inspecting a semiconductor device includes establishing a first circuit state in which electrical conduction through at least one of branch transmission line portions is established and electrical conduction through at least one other branch transmission line portion is prevented. Then, electrical signal reflection characteristics of the transmission line are measured. The method also includes establishing a second circuit state in which electrical conduction through the at least one of the branch transmission line portions is prevented and electrical conduction through the at least one other branch transmission line portions is established. Then, the electrical signal reflection characteristics of the transmission line are measured. The second circuit state is a mirror image of the first circuit state with respect to the primary transmission line. The measured values are compared.

6 Claims, 15 Drawing Sheets

METHOD FOR INSPECTING TRANSMISSION LINE CHARACTERISTIC OF A SEMICONDUCTOR DEVICE USING SIGNAL REFLECTION MEASUREMENT

FIELD OF THE INVENTION

The present invention relates to semiconductor devices and methods for inspecting the same.

BACKGROUND ART

Semiconductor devices having a plurality of signal input/output connection ports (hereinafter also referred to simply as "connection ports") have been known in the art (see, e.g., JP-A-2002-237574). These connection ports are interconnected by a transmission line and allow connection with external circuitry. In the semiconductor device disclosed in the above patent publication, each connection port includes a signal pad and ground pads. These pads are also used as probe pads contacted, or probed, by an inspection probe when the semiconductor device is inspected.

In conventional methods for inspecting such a semiconductor device, each of the plurality of signal input/output connection ports is contacted, or probed, by an inspection probe. For example, in the case of inspecting the transmission path between two connection ports, each connection port is contacted by an inspection probe, and electrical characteristics of the transmission path are measured both when electrical conduction between these connection ports is established and when it is prevented. (This inspection method is hereinafter also referred to simply as the "2-port measurement.") when the transmission path between one pair of ports has been inspected, another pair of ports are contacted by the inspection probes and the transmission path between these ports is inspected in the same manner.

Other conventional art includes JP-A Nos. 2000-188501, 2002-033602, 11-186803 (1999), and 2002-237574.

The above conventional inspection methods require a number of 2-port measurements corresponding to the number of connection ports to be probed; that is, the more connection ports to be inspected, the more times the measuring system must be reset and calibrated, resulting increased inspection time.

SUMMARY OF THE INVENTION

The present invention has been devised to solve the above problems. It is, therefore, an object of the present invention to provide a simplified, less time consuming method for inspecting a semiconductor device. Another object of the present invention is to provide a semiconductor device suitable for such an inspection method.

According to one aspect (aspect 1) of the present invention, a method for inspecting a semiconductor device is presented as follows.

In the aspect 1, the semiconductor device includes a primary connection port, which includes a signal pad and a ground pad. The semiconductor device also includes a transmission line. The transmission line includes a primary transmission line portion and a plurality of branch transmission line portions. The primary transmission line portion includes a branch node and being connected to the primary connection port. The plurality of branch transmission line portions extending symmetrically from the branch node with respect to the primary transmission line portion and an imaginary extension thereof.

In the aspect 1, the semiconductor device also includes connection ports, which are symmetrically arranged with respect to the primary transmission line portion and the imaginary extension thereof. Each connection port are connected to a respective one of the plurality of branch transmission line portions. Each connection ports includes at least a signal pad.

In the aspect 1, the semiconductor device also includes active elements, wherein each active element is connected to a respective one of the plurality of branch transmission line portions. Each active element is capable of establishing and preventing electrical conduction through the respective one of the plurality of branch transmission line portions.

Furthermore, in this aspect, the method for inspecting the above semiconductor device includes below steps.

A step of, establishing a first circuit state in which electrical conduction through at least one of the plurality of branch transmission line portions is established and electrical conduction through at least one of the other branch transmission line portions is prevented. Then, measuring electrical signal reflection characteristics of the transmission line at the primary connection port to obtain a first measured value.

A step of, establishing a second circuit state in which electrical conduction through the at least one of the plurality of branch transmission line portions is prevented and electrical conduction through the at least one of the other branch transmission line portions is established. Then, measuring the electrical signal reflection characteristics of the transmission line at the primary connection port to obtain a second measured value. The second circuit state is a mirror image of the first circuit state with respect to the primary transmission line portion and the imaginary extension thereof.

A step of, comparing the first and second measured values to determine characteristics of the transmission line.

According to another aspect (aspect 2) of the present invention, a method for inspecting a semiconductor device is presented as follows.

In the aspect 2, the semiconductor device includes two primary connection ports. Each the primary connection port includes a signal pad and a ground pad. The semiconductor device further includes a transmission line, which includes a primary transmission line portion and a plurality of branch transmission line portions. The primary transmission line portion includes a branch node and is connected between the two primary connection ports. The plurality of branch transmission line portions extend symmetrically from the branch node with respect to the primary transmission line portion and an imaginary extension thereof.

In the aspect 2, the semiconductor device further includes connection ports, which are symmetrically arranged with respect to the primary transmission line portion and the imaginary extension thereof. Each connection port is connected to a respective one of the plurality of branch transmission line portions and includes at least a signal pad.

In the aspect 2, the semiconductor device further includes active elements. Each the active element is connected to a respective one of the plurality of branch transmission line portions and is capable of establishing and preventing electrical conduction through the respective one of the plurality of branch transmission line portions.

Furthermore, in the aspect 2, the method for inspecting the above semiconductor device includes below steps.

A step of, establishing a first circuit state in which electrical conduction through at least one of the plurality of branch transmission line portions is established and electrical conduction through at least one of the other branch transmission line portions is prevented. Then, measuring electrical signal transmission characteristics between the two primary connection ports to obtain a first measured value.

A step of, establishing a second circuit state in which electrical conduction through the at least one of the plurality of branch transmission line portions is prevented and electrical conduction through the at least one of the other branch transmission line portions is established. Then, measuring the electrical signal transmission characteristics between the two primary connection ports to obtain a second measured value. The second circuit state is a mirror image of the first circuit state with respect to the primary transmission line portion and the imaginary extension thereof.

A step of, comparing the first and second measured values to determine characteristics of the transmission line.

According to further another aspect (aspect 3) of the present invention, a method for inspecting a semiconductor device is presented as follows.

In the aspect 3, the semiconductor device includes a primary connection port which includes a signal pad. The semiconductor device also includes a transmission line which includes a primary transmission line portion and a plurality of branch transmission line portions. The primary transmission line portion includes a branch node and is connected to the primary connection port. The plurality of branch transmission line portions extend symmetrically from the branch node with respect to the primary transmission line portion and the imaginary extension thereof.

In the aspect 3, the semiconductor device further includes connection ports which are symmetrically arranged with respect to the primary transmission line portion and the imaginary extension thereof. Each of the connection ports is connected to a respective one of the plurality of branch transmission line portions, and the each of the connection ports includes least a signal pad.

In the aspect 3, the semiconductor device further includes active elements. Each of the active elements is connected to a respective one of the plurality of branch transmission line portions. The each of the active elements is capable of establishing and preventing electrical conduction through the respective one of the plurality of branch transmission line portions.

In the aspect 3, the semiconductor device further includes a ground pad which is disposed adjacent the branch node.

Furthermore, in the aspect 3, the method for inspecting the above semiconductor device include below steps.

A step of, establishing a first circuit state in which electrical conduction through at least one of the plurality of branch transmission line portions is established and electrical conduction through at least one of the other branch transmission line portions is prevented. Then, measuring electrical signal reflection characteristics of the transmission line by contacting an inspection probe with the branch node to obtain a first measured value.

A step of, establishing a second circuit state in which electrical conduction through the at least one of the plurality of branch transmission line portions is prevented and electrical conduction through the at least one of the other branch transmission line portions is established. Then, measuring the electrical signal reflection characteristics of the transmission line by contacting the inspection probe with the branch node to obtain a second measured value. The second circuit state is a mirror image of the first circuit state with respect to the primary transmission line portion and the imaginary extension thereof.

A step of, comparing the first and second measured values to determine characteristics of the transmission line.

According to further another aspect (aspect 4) of the present invention, a semiconductor device is presented as follows.

In the aspect 4, the semiconductor device includes a transmission line. The transmission line includes a primary transmission line portion and a plurality of branch transmission line portions. The primary transmission line portion includes a branch node. The plurality of branch transmission line portions extend symmetrically from the branch node with respect to the primary transmission line portion and an imaginary extension thereof.

In the aspect 4, the semiconductor device further includes three or more connection ports connected to the transmission line. The connection ports each include a signal pad. At least one of the three or more connection ports includes a ground pad. And at least two of the three or more connection ports do not include a ground pad.

In the aspect 4, the semiconductor device further includes active elements each connected to a respective one of the plurality of branch transmission line portions. The active elements are capable of establishing and preventing electrical conduction through the respective one of the plurality of branch transmission line portions.

The at least one of the connection ports including the ground pad is connected to the primary transmission line portion.

Each of the at least two of the connection ports not including a ground pad is connected to the plurality of branch transmission line portions. The plurality of branch transmission line portions connecting to the connection ports not including a ground pad are symmetrically arranged with respect to the primary transmission line portion and the imaginary extension thereof.

According to further another aspect (aspect 5) of the present invention, a semiconductor device is presented as follows.

In the aspect 5, the semiconductor device includes a transmission line including a primary transmission line portion and a plurality of branch transmission line portions. The primary transmission line portion includes a branch node, and the plurality of branch transmission line portions extend symmetrically from the branch node with respect to the primary transmission line portion and an imaginary extension thereof.

In the aspect 5, the semiconductor device further includes three or more connection ports connected to the transmission line. The connection ports each includes a signal pad.

In the aspect 5, the semiconductor device further includes active elements each connected to a respective one of the plurality of branch transmission line portions. The active elements are capable of establishing and preventing electrical conduction through the respective one of the plurality of branch transmission line portions.

In the aspect 5, the semiconductor device further includes a ground pad disposed adjacent the branch node.

Other and further objects, features and advantages of the invention will appear more fully from the following description.

DETAILED DESCRIPTION OF THE PREFERRED EMBODIMENTS

Preferred embodiments of the present invention will now be described. It should be noted that in the figures like numerals are used to denote like components to avoid undue repetition.

First Embodiment

Inspection Method of First Embodiment

There will be described a method for inspecting a semiconductor device according to a first embodiment of the present invention. For clarity of description, a conventional inspection method is first described before describing the inspection method of the present embodiment. It should be noted that the semiconductor device described in connection with the inspection method of the present embodiment includes components (pads, active elements, etc.) identical to those of the semiconductor device described in connection with the conventional inspection method. These components will be described only when describing the conventional inspection method in order to avoid undue repetition.

(Conventional Inspection Method)

The conventional method for inspecting a semiconductor device will be described with reference to FIGS. 18 to 20. Specifically, this inspection method will be described in connection with a semiconductor device including a switch circuit device. The following description will be directed to inspection of high frequency characteristics of the semiconductor device.

Figure 18:
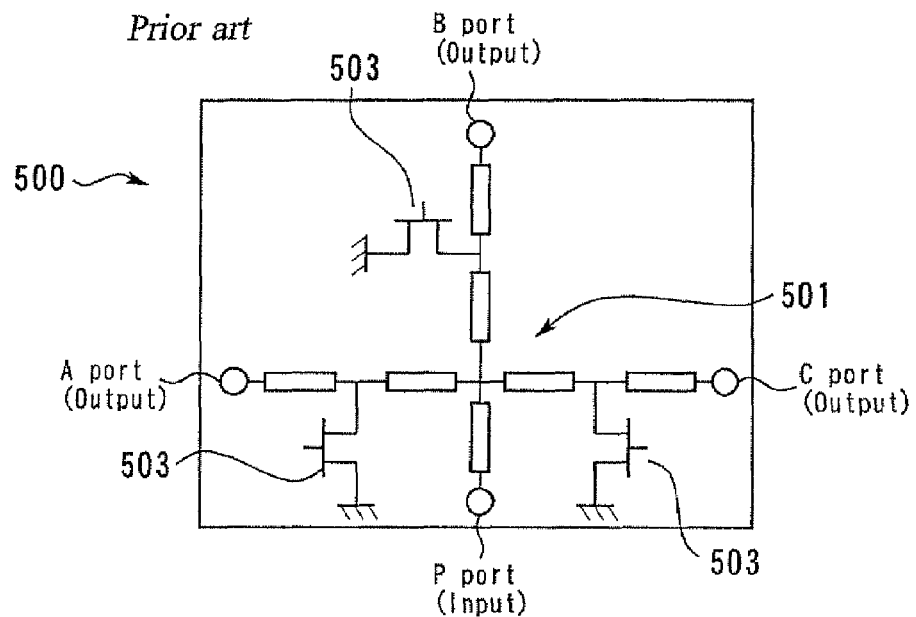
FIG. 18 is a schematic circuit diagram of a semiconductor device in connection with which the conventional inspection method will be described.

FIG. 18 is a schematic circuit diagram of a semiconductor device 500 in connection with which the conventional inspection method will be described. The semiconductor device 500 is a high frequency signal switch including a switch circuit device 501. The switch circuit device 501 has four connection ports including one signal input port (referred to herein as a "P port") and three signal output ports (referred to herein as an "A port," a "B port," and a "C port," respectively).

As shown in FIG. 18, the switch circuit device 501 includes an active element 503 for each signal output port. The P port and any one of the A, B, and C ports can be connected as necessary by suitably controlling these active elements 503. This allows the high frequency signal received by the P port to be delivered to a desired port. Conversely, the signal received by any one of the A, B, and C ports can be output to the P port. It should be noted that the following example assumes the active elements 503 to be FETs. However, other known active elements can be used instead of FETs.

Thus, the semiconductor device 500 can operate as a switch having either one input port and three output ports, or one output port and three input ports. (This type of switch is referred to as the "single pole three throw switch," or "SP3T switch.") Such switches are disclosed in the above JP-A-2002-237574, etc. It should be further noted that a switch having one input port and n number of output ports is referred to as an "SPnT switch."

In the case where an FET is connected in shunt (or in parallel) with a transmission line (as in the semiconductor device 500), the output port of the transmission line is turned off (or shunted to ground) when the FET is turned on, which is achieved by applying a voltage of 0 V (or close to 0 V, e.g., −0.2 V) to its gate port. On the other hand, the port is turned on when the FET is turned off, which is achieved by applying a sufficiently large negative voltage (e.g., −3 V) to its gate port.

Figure 19:
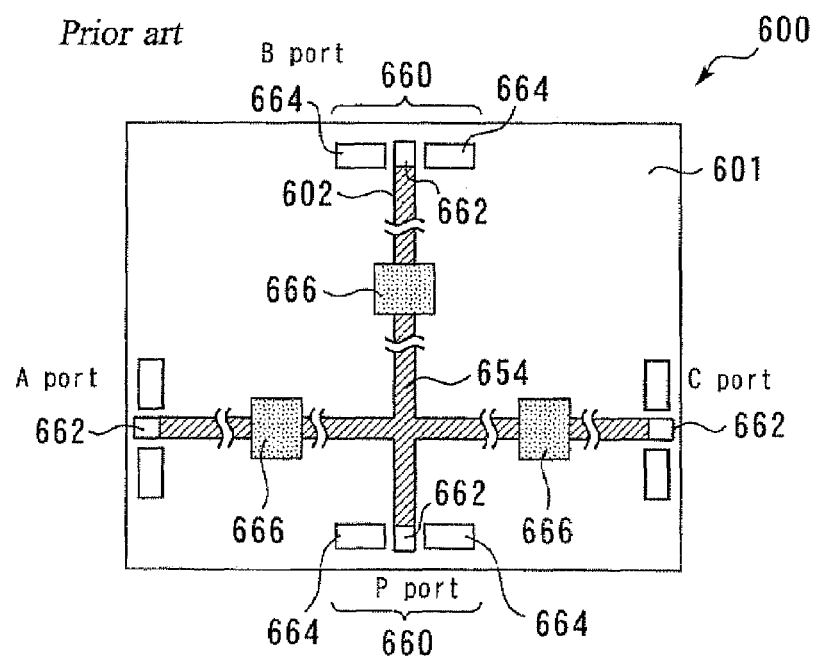
FIG. 19 is a schematic diagram showing the circuit configuration on the surface of a semiconductor device (a SP3T switch).

FIG. 19 is a schematic diagram showing the circuit configuration on the surface of a semiconductor device 600, which is an implementation of the semiconductor device (or circuit) 500 shown in FIG. 18. The semiconductor device 600 includes a semiconductor substrate 601 and a transmission line 654 that extends on the semiconductor substrate 601. The transmission line 654 corresponds to the switch circuit device 501 shown in FIG. 18. Connection ports (a P port and A, B, and C ports) are provided at the ends of the transmission line 654. Each connection port includes a measurement pad 660 made up of a signal pad 662 and ground pads (or ground potential supply pads) 664. These measurement pads 660 are probed by a high frequency characteristics measuring probe to measure high frequency characteristics of the transmission line 654 (as described later). The connection ports are symmetrically arranged with respect to the P port to equalize the high frequency characteristics of the transmission paths connected to these ports.

In order to allow measurement of high frequency characteristics of the transmission line 654, each ground pad 664 is electrically coupled to the bottom surface of the semiconductor device 600 (which is usually held at ground potential) through a conductive through-hole (not shown) called a via hole. This via hole is made up of a through-hole extending from the top surface to the bottom surface of the semiconductor device 600, and Au plating formed on the inner surface of the through-hole. The semiconductor device 600 shown in FIG. 19 also includes active elements 666 connected to the transmission line 654. These active elements 666 correspond to the active elements 503 shown in FIG. 18.

Figure 20A:
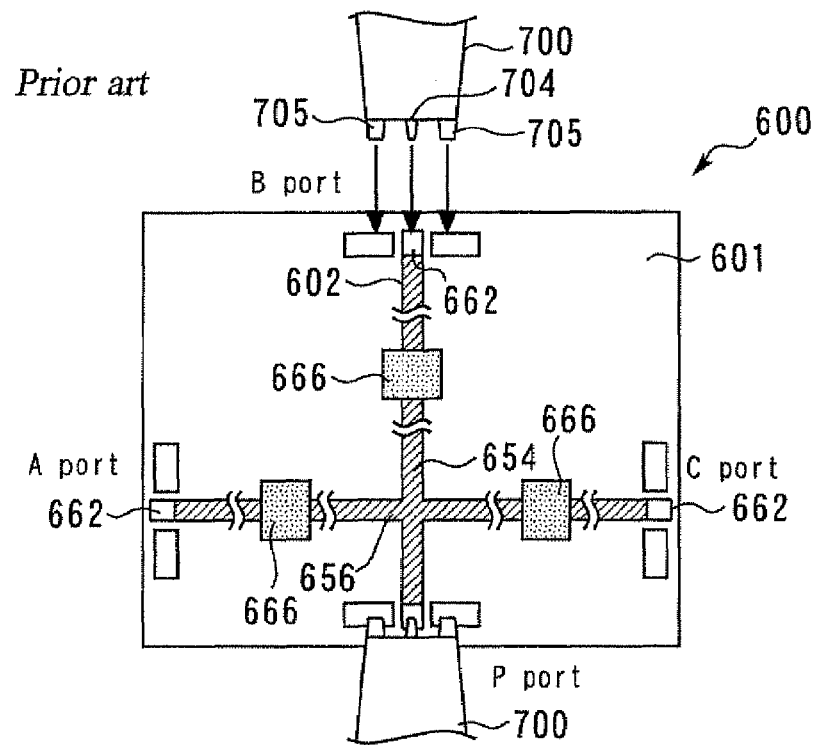
FIG. 20 (including FIGS. 20A and 20B) is a schematic diagram showing 2-port measurement (a method for measuring high frequency characteristics of a conventional high frequency switch circuit device).
Figure 20B:
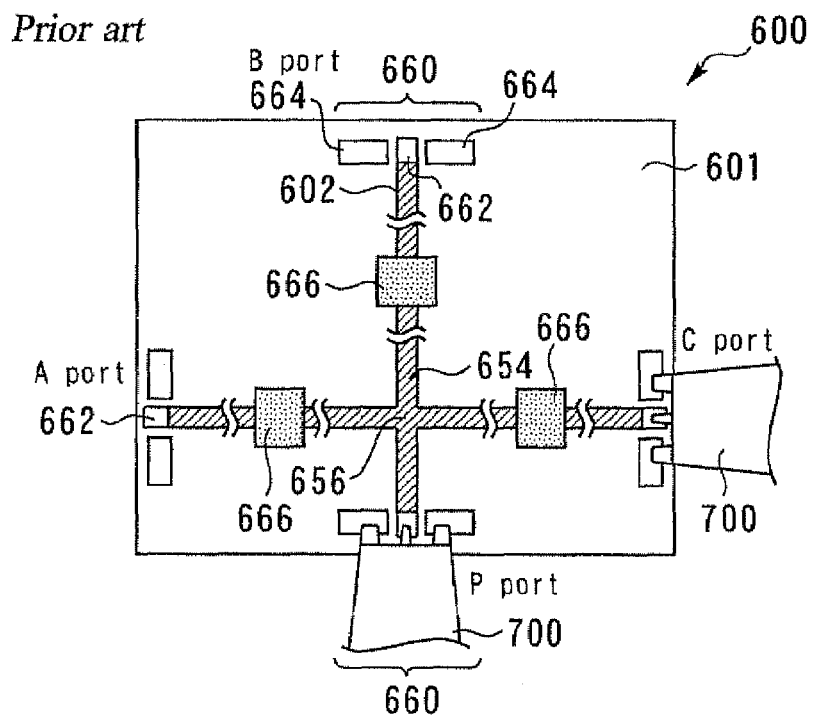

FIG. 20 (including FIGS. 20A and 20B) is a schematic diagram showing a method for measuring high frequency characteristics of a conventional high frequency switch circuit device. Specifically, FIG. 20A shows the positions of the probes (700) when the transmission path between the P and B ports is examined, and FIG. 20B shows the positions of the probes when the transmission path between the P and C ports is examined.

Each high frequency characteristics measuring probe 700 shown in FIG. 20 includes one high frequency signal transmission probe needle 704 and two ground potential probe needles 705 (i.e., a total of three probe needles). The high frequency signal measuring probes 700 are used to apply and receive high frequency signals from the ports and are also referred to as "RF probes."

In each high frequency characteristics measuring probe 700, the ground potential probe needles 705 are disposed on both sides of the high frequency signal transmission probe needle 704. When inspecting the semiconductor device, the high frequency characteristics measuring probes 700 are first connected to a high frequency characteristics measuring apparatus (not shown) and then brought into contact with the target high frequency characteristics measurement pads 660 to measure high frequency characteristics of the high frequency switch circuit device.

When the high frequency characteristics of the transmission path between the P and B ports is measured, as shown in FIG. 20A, the measurement pads 660 of the A and C ports are electrically terminated by use of other high frequency signal measuring probes 700 and terminators. Alternatively, the measurement pads 660 of the A and C ports may be open circuited, and a potential may be applied to the active elements connected to the A and C ports so as to turn off these ports. High frequency characteristics of the transmission path between the P and B ports are then measured both when the B port is turned on and when it is turned off with the measurement pads 660 of the A and C ports electrically terminated or open circuited as described above.

A 2-port measurement is also performed on the transmission paths between the P and C ports and between P and A ports by probing the measurement pads 660 of these ports with high frequency signal measuring probes 700. That is, in order to measure high frequency characteristics of the transmission paths connected to the A, B, and C ports, this conventional inspection method performs a total of three 2-port measurements (that is, between the P and A ports, between P and B ports, and between the P and C ports).

Conventional methods for inspecting a semiconductor device usually perform such a high frequency signal 2-port measurement on each pair of input and output ports. Specifically, high frequency characteristics of the transmission path between each pair of input and output ports are measured both when both ports are connected to the path (i.e., transmission characteristics) and when only the input port is connected to the path (i.e., reflection characteristics). The two measurements are used to determine whether the transmission path is defective. That is, the above inspection method measures both the transmission and reflection characteristics of the straight transmission path (or straight path) between the P and B ports and the bent transmission paths (or bent paths or branch paths) between the P and A ports and between the P and C ports.

However, the inspection method is disadvantageous in that it is necessary to reset and calibrate the measuring system each time a different transmission path is inspected, resulting in increased setup time. In order to enhance efficiency of the inspection process and hence the manufacturing process, it is necessary to reduce the number of times the measuring system is reset and calibrated and thereby reduce the inspection time.

(Inspection Method of First Embodiment)

Figure 1:
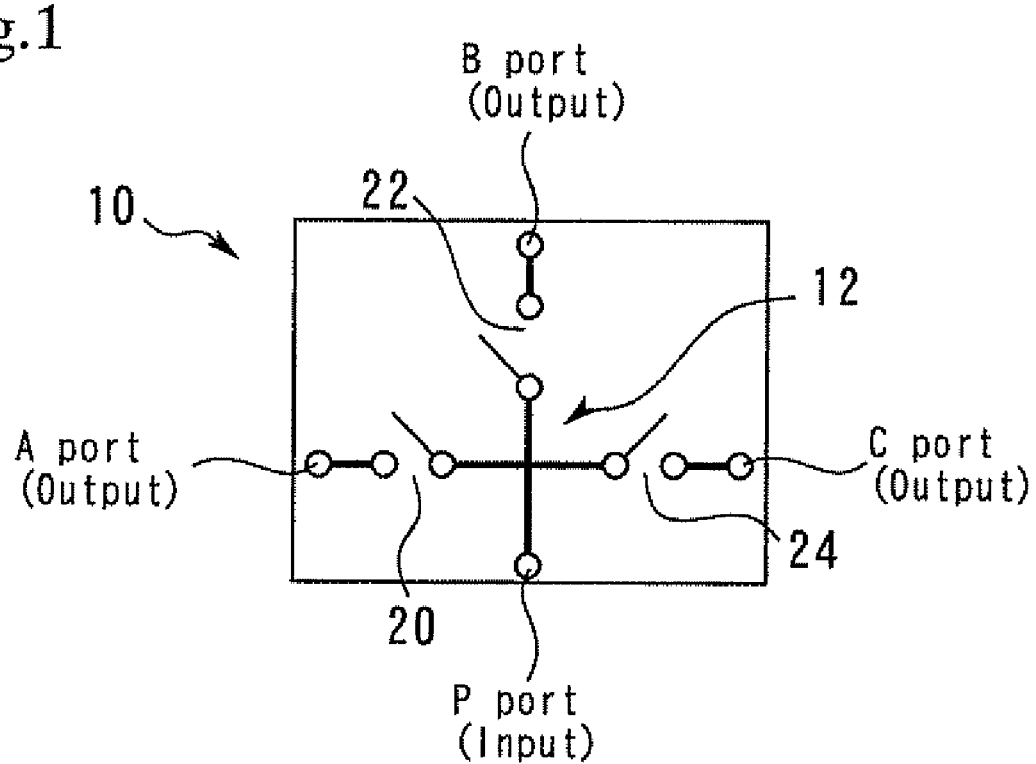
FIG. 1 is a schematic circuit diagram of a semiconductor device relating to a first embodiment.

To address the above problems, the present embodiment provides the following method for inspecting a semiconductor device. FIG. 1 is a schematic circuit diagram of a semiconductor device 10. The inspection method of the present embodiment will be described with reference to this semiconductor device. The semiconductor device 10 has the same circuit configuration as the semiconductor device 600 described in connection with the above conventional inspection method.

Reference numeral 10 denotes a semiconductor device in connection with which the inspection method of the present embodiment will be described (as described above). Reference numeral 12 denotes the high frequency switch circuit device of the semiconductor device 10. Further, reference numeral 20 denotes an on-off switch for the A port, reference numeral 22 denotes an on-off switch for the B port, and reference numeral 24 denotes an on-off switch for the C port. These switches 20, 22, 24 may be each implemented by an active element such as an FET, as in the case of the conventional semiconductor device described above.

In the circuit layout of the high frequency switch circuit device 12 of the semiconductor device 10 of the present embodiment, the P port is designed to be the primary (or reference) port. In the semiconductor device 10, the transmission line has a cross configuration, as shown in FIG. 1, and the cross point is referred to herein as the "branch node." Accordingly, the transmission path between the directly opposing P and B ports is a straight path, and the transmission paths between the P and A ports and between the P and C ports are bent paths (or branch paths). These bent paths are symmetrical to each other with respect to the straight path.

Figure 2A:
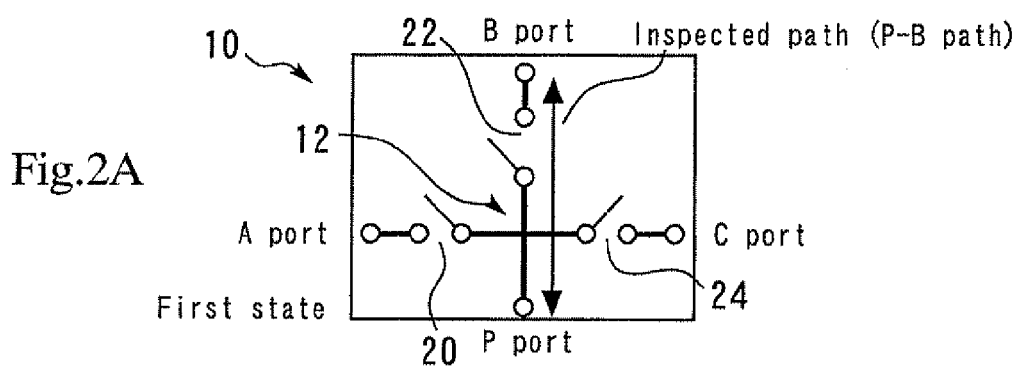
FIGS. 2A to 2D are diagrams illustrating the method of inspection in the first embodiment.
Figure 2B:
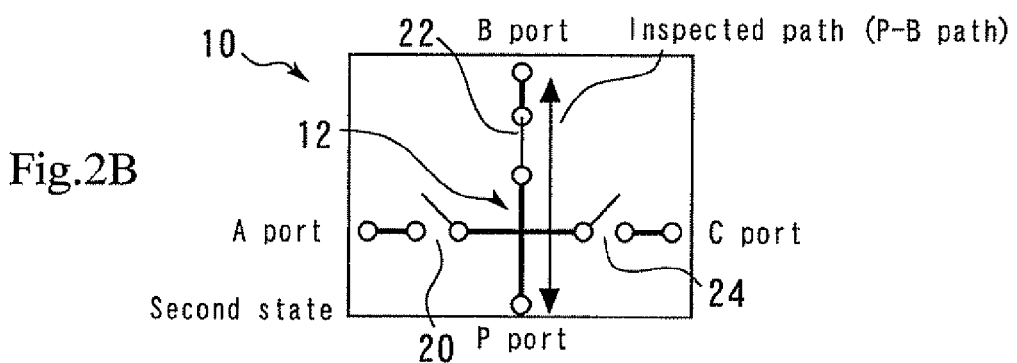

FIGS. 2A to 2D are diagrams illustrating the method of the present embodiment for inspecting the semiconductor device 10 shown in FIG. 1. This method begins by turning off all bent paths (or cutting off the flow of electricity through each bent path). High frequency (switch) characteristics of the straight path are then measured both when the on-off switch 22 for the B port is turned on and turned off to determine whether the straight path is defective, as shown in FIGS. 2A and 2B.

Such measurement of high frequency characteristics of the straight path can be achieved by a conventional 2-port measurement technique. Throughout the remainder of this specification the transmission line and the straight path are said to be in the first state when the straight path and all bent paths are turned off (as shown in FIG. 2A) and are said to be in the second state when the straight path is turned on (i.e., the on-off switch 22 is turned on) and all bent paths are turned off (as shown in FIG. 2B).

Figure 2C:
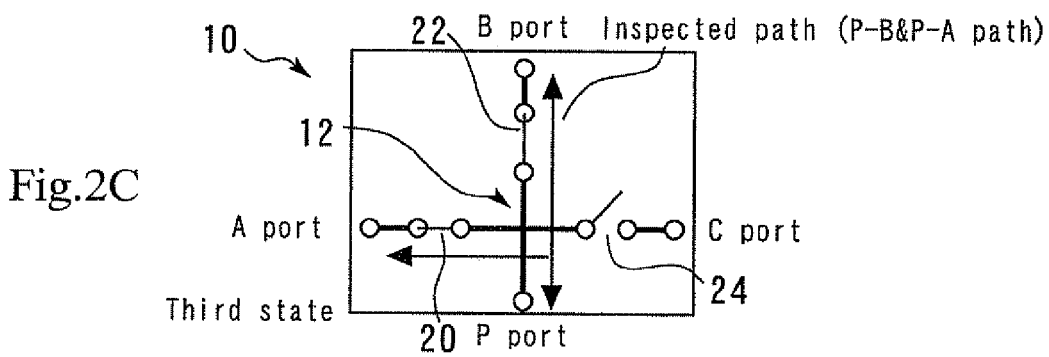
Figure 2D:
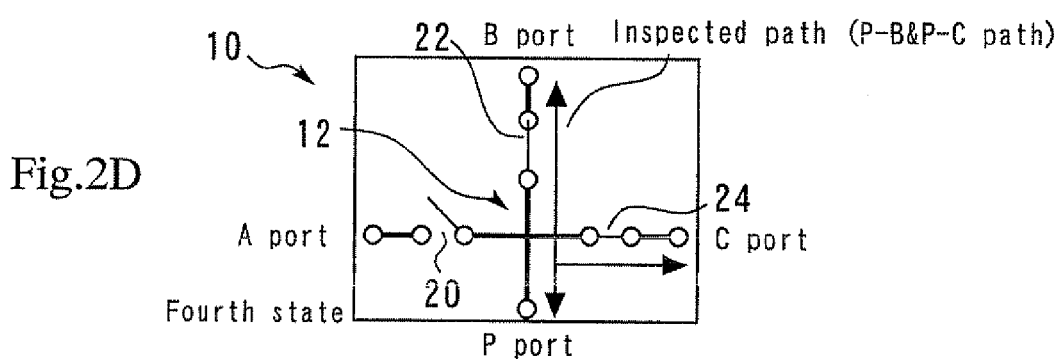

Further, the transmission line and the straight path are said to be in the third state when the straight path and the bent path between the P and A ports are turned on (i.e., the on-off switches 20 and 22 are turned on) and the bent path between the P and C ports is turned off (i.e., the on-off switch 24 is turned off), as shown in FIG. 2C. Still further, the transmission line and the straight path are said to be in the fourth state when the straight path and the bent path between the P and C ports are turned on (i.e., the on-off switches 22 and 24 are turned on) and the bent path between the P and A ports is turned off (i.e., the on-off switch 20 is turned off), as shown in FIG. 2D. Referring now to FIGS. 2C and 2D, the inspection method of the present embodiment then measures the high frequency characteristics of the straight path in the third and fourth states described above.

The bent paths connected to the A and C ports are symmetrical to each other with respect to the straight path. This means that if these two bent paths are not defective and hence have equal characteristics, the above measured high frequency characteristics of the straight path in the third and fourth states are substantially identical to each other. On the other hand, if at least one of the bent paths is defective, these measured high frequency characteristics are not identical.

Therefore, the inspection method of the present embodiment compares the above measured high frequency characteristics of the straight path in the third and fourth states and if they are substantially identical to each other, the method determines that the bent paths connected to the A and C ports are not defective. On the other hand, if the measured characteristics are not identical, the method determines that at least one of the bent paths connected to the A and C ports is defective. There will now be described an exemplary inspection process using this method with reference to FIG. 3.

Figure 3:
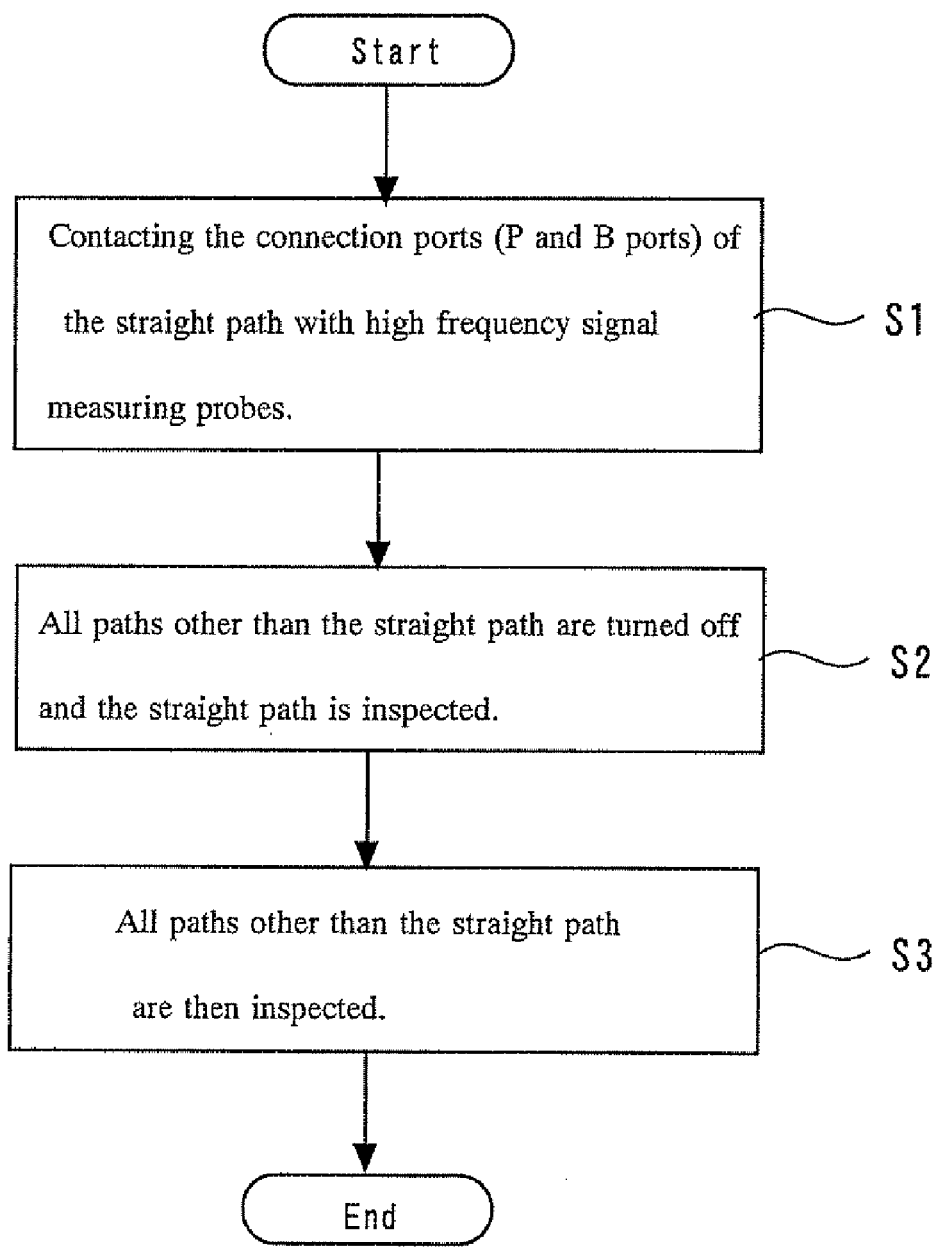
FIG. 3 is a flowchart of the inspection process using the inspection method of the present embodiment.

FIG. 3 is a flowchart of the inspection process using the inspection method of the present embodiment. The process begins by contacting the connection ports (P and B ports) of the straight path with high frequency signal measuring probes at step S1. Next, all paths other than the straight path are turned off and the straight path is inspected at step S2.

All paths other than the straight path are then inspected at step S3. Specifically, in this step, the high frequency signal measuring probes are kept in contact with the connection ports of the straight path, and the active elements (or on-off switches) are turned on or off to set the transmission line in the third state and then in the fourth state and measure high frequency characteristics of the straight path in these states. The measured high frequency characteristics of the straight path in the third and fourth states are then compared to determine whether each port and the bent path connected thereto are defective.

More specifically, according to the present embodiment, the transmission characteristics and the reflection characteristics of the straight path in the third state are first measured. (The measurement results are referred to herein as "third state measurement results.") Then, the transmission characteristics and the reflection characteristics of the straight path in the fourth state are measured. (The measurement results are referred to herein as fourth state measurement results.) These measurement results are then compared. If the measured reflection and transmission characteristics of the straight path in the third state are identical to those of the straight path in the fourth state, then it is determined that the A and C ports and the bent paths connected thereto are not defective. It should be that only either the reflection characteristics or the transmission characteristics may be compared to make the above determination.

Figure 4A:
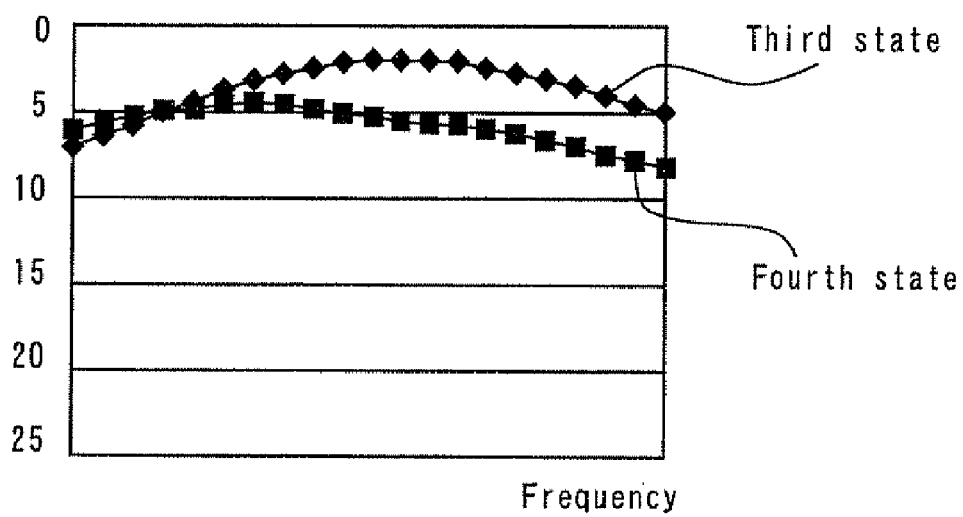
FIGS. 4A to 4D show measured high frequency characteristics of a defective device and a non-defective device.

FIGS. 4A to 4D show measured high frequency characteristics of a defective device and a non-defective device. Specifically, FIG. 4A shows measured high frequency signal reflection characteristics of the straight transmission path between the P and B ports of the defective device (having degraded characteristics) both in the third and fourth states. The horizontal axis represents frequency, and the vertical axis represents reflection loss (in db).

Figure 4B:
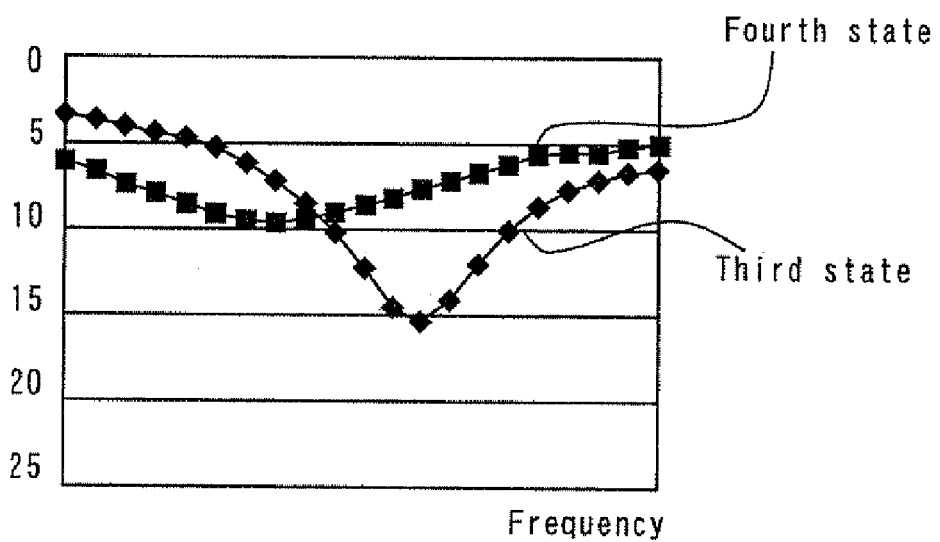

FIG. 4B shows measured transmission characteristics of the straight path between the P and B ports of the defective device in the third and fourth states. The horizontal axis represents frequency, and the vertical axis represents transmission loss (in db). If the straight path does not exhibit identical characteristics in the third and fourth states (as shown in FIGS. 4A and 43), the inspection method determines that at least one of the A and C connection ports or the bent paths connected thereto is defective.

Figure 4C:
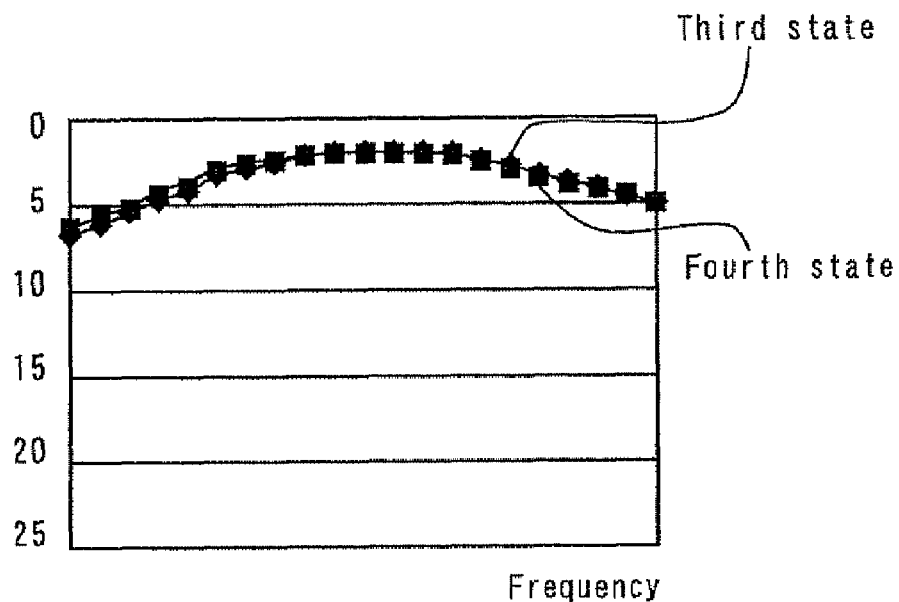
Figure 4D:
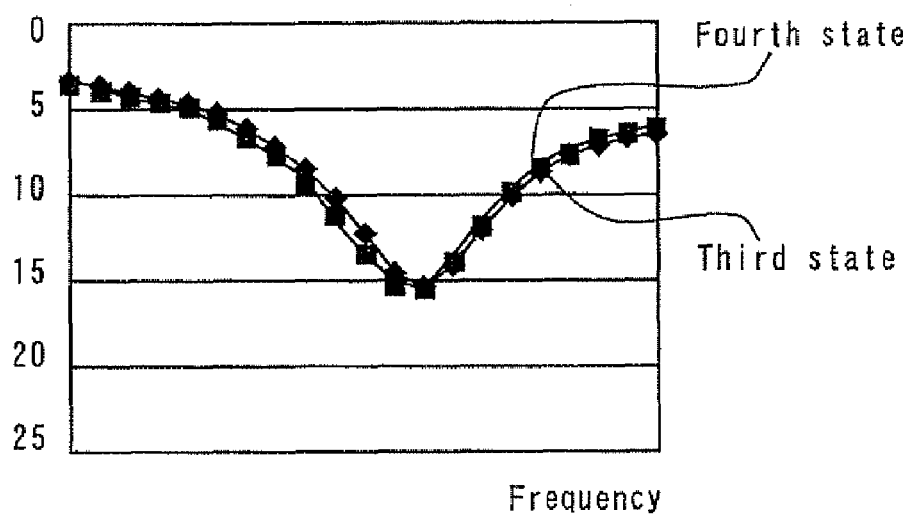

FIG. 4C shows measured high frequency signal reflection characteristics of the straight path between the P and B ports of the non-defective device in both the third and fourth states. FIG. 4D, on the other hand, shows measured transmission characteristics of the straight path between the P and B ports of the non-defective device in both the third and fourth states. If the straight path exhibits identical characteristics in the third and fourth states (as shown in FIGS. 4C and 4D), the inspection method determines that the A and C ports and the bent paths connected thereto are not defective. Though not shown, the straight path exhibits substantially identical characteristics in the first and second states even if the semiconductor device has a defective bent path(s).

The above inspection method allows a reduction in the number of times the measuring system is reset and calibrated, as compared to conventional inspection methods employing a 2-port measurement technique. That is, the method measures characteristics of the straight path in the third and fourth states and compares the measured characteristics to determine whether the bent paths connected to the A and C ports are defective. Thus, the above inspection method allows a reduction in the time required to inspect these bent paths, as compared to conventional inspection methods in which the bent paths connected to the A and C ports are inspected separately by measuring the electrical characteristics of each bent path with the other bent paths turned off.

In conventional inspection methods, a 2-port measurement is performed on each path, which requires that its signal input/output ports be contacted by an inspection probe. On the other hand, the inspection method of the present embodiment determines whether the bent paths between the P and A ports and between the P and C ports are defective without performing a 2-port measurement.

Therefore, the inspection method of the present embodiment allows one to omit probing the A and C ports when inspecting the bent paths connected to these ports, resulting in reduced number of probing operations (or inspection probes). This also results in a reduction in the number of times the measuring system is reset (including positioning of inspection probes).

It should be noted that although the inspection method of the present embodiment has been described with reference to a semiconductor device including an SP3T switch, the method may be applied to other switch devices. Any SPnT switch with an odd number of throws (i.e., an SP5T switch, an SP7T switch, etc.) includes a straight path. This means that in these SPnT switches the bent paths are symmetrically arranged with respect to the straight path, which allows one to inspect the switches using the inspection method of the present embodiment by appropriately turning on or off each bent path. In this way, it is possible to reduce the number of times the measuring system is reset and calibrated, resulting in reduced inspection time, as compared to conventional inspection methods using a 2-port measurement technique.

When the inspection method of the present embodiment is applied to an SPnT switch having 5 or more throws (such as an SP5T or SP7T switch), a plurality of bent paths in the switch may be simultaneously turned on and electrical characteristics of the straight path (or transmission line) may be measured in this state. This arrangement also allows one to detect whether the high frequency (switch) characteristics of the bent paths are abnormal.

For example, in the case of an SP5T switch, there are two bent paths on each side of the straight path. Therefore, electrical characteristics of the straight path is first measured after turning on the two bent paths on one side of the straight path and turning off the two bent paths on the other side. Next, the bent paths on the one side are turned off and those on the other side are turned on and then electrical characteristics of the straight path are measured again in this connection state. The measured characteristics of the straight path in the above two connection states are compared to determine whether the bent paths (or ports) are defective. Thus, when the inspection method of the present embodiment is applied to an SPnT switch with 5 or more throws, a plurality of bent paths in the switch may be simultaneously turned on in the manner described above.

When an SPnT switch is inspected using a conventional inspection method using a 2-port measurement technique, the measuring system must be set and calibrated n number of times (that is, an SP3T switch requires the measuring system to be set and calibrated three times). That is, the more ports, the longer the setup time. On the other hand, the inspection method of the present embodiment allows one to omit probing the connection ports of bent paths and thereby to inspect a switch having many connection ports by performing a relatively small number of probing operations (or using a relatively small number of probes).

[Semiconductor Devices of First Embodiment]

There will be described the configurations of semiconductor devices of the present embodiment with reference to FIGS. 5 to 7. These semiconductor devices are suitable for the inspection method of the present embodiment described above. They include an SPnT switch circuit device and exhibit high performance in the microwave and milliwave ranges.

SPnT switches may be divided into two types: those having an odd number of throws, such as SP3T and SP5T switches (hereinafter also referred to as "odd type" SPnT switches); and those having an even number of throws, such as SP2T and SP4T switches (hereinafter also referred to as "even type" SPnT switches). Each SPnT switch having 3 or more throws includes a primary (or reference) transmission line portion (e.g., in the present embodiment, the straight path), which is connected to a primary (or reference) port (e.g., in the present embodiment, the P port), and further includes a plurality of branch transmission line portions (e.g., in the present embodiment, the bent paths) branching off from the primary transmission line portion. There will now be described a semiconductor device of the present embodiment that includes an "odd type" SPnT switch and semiconductor devices of the present embodiment that include an "even type" SPnT switch.

It should be noted that the semiconductor devices described below are assumed to include FETs as their active elements. However, they may include other known active elements instead of FETs. Further, according to the present embodiment, these semiconductor devices are assumed to include a microstrip transmission line as their transmission line.

(Semiconductor Device Including "Odd Type" SPnT Switch Circuit Device)

Figure 5:
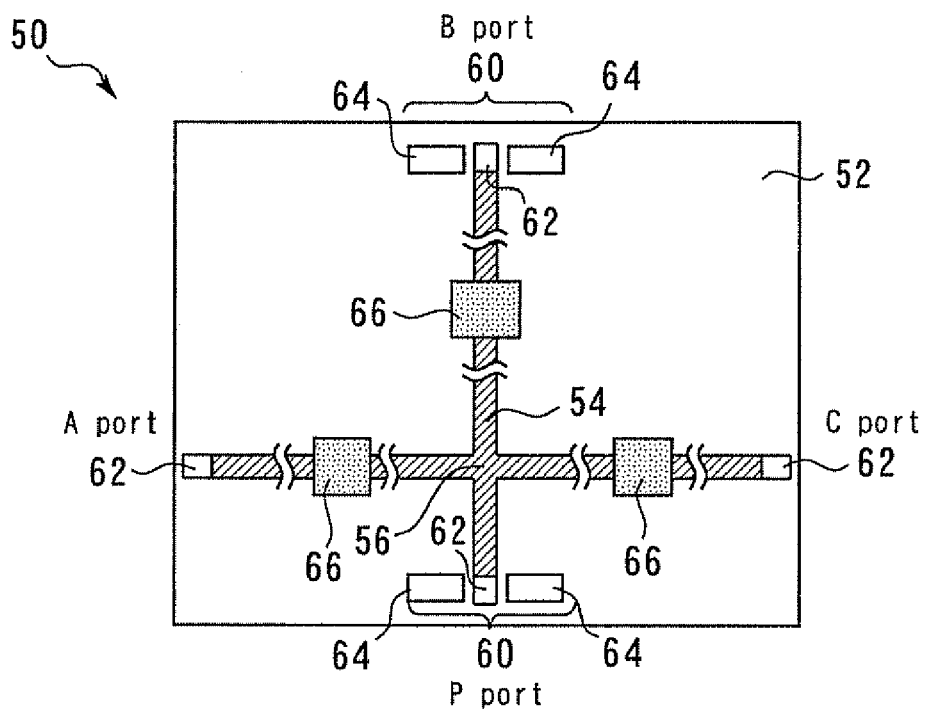
FIG. 5 is a diagram showing the configuration of a SP3T switch circuit device according to the first embodiment.

FIG. 5 is a diagram showing the configuration of a semiconductor device 50 including an "odd type" SPnT switch circuit device according to the present embodiment. Referring to FIG. 5, reference numeral 54 denotes a transmission line, reference numeral 62 denotes signal input/output pads provided at the ends of the transmission line 54, and reference numeral 64 denotes ground potential supply pads (or ground pads) disposed in close proximity to both sides of two signal pads 62. Each of the two signal pads 62 and the two adjacent ground pads 64 form a high frequency characteristics measurement pad 60.

The semiconductor device 50 includes components corresponding to the P, A, B, and C ports, the straight path, and the bent paths of the semiconductor device 10. In the semiconductor device 50, the high frequency characteristics measurement pad 60 on the lower side (as viewed in FIG. 5) of the substrate 52 constitutes the P port. Further, the high frequency characteristics measurement pad 60 on the upper side (as viewed in FIG. 5) of the substrate 52 constitutes the B port.

The portion of the transmission line 54 extending in the vertical direction (as viewed in FIG. 5) constitutes the straight path. The transmission line 54 has an intermediate node, or branch node, 56 from which branches extend to connect with the signal pads 62 of the A and C ports. An active element 66 is connected to the transmission line 54 at an intermediate point between the branch node 56 and each connection port. Each active element 66 can establish and prevent electrical conduction through the portion of the transmission line 54 (i.e., the branch of the transmission line 54) between the branch node 56 and a respective connection port.

Further, the signal pads 62 on the left and right sides (as viewed in FIG. 5) of the substrate 52 constitute the A and C ports, respectively. In the semiconductor device 50, the P and B ports include both a signal pad 62 and ground pads 64. The A and C ports, on the other hand, do not include ground pads 64, though they include a signal pad 62.

As described above, the inspection method of the present embodiment allows one to omit probing bent paths. This means that the A and C ports do not require ground pads which are to be contacted by the ground potential probe needle of an inspection probe. Therefore, in the semiconductor device of the present embodiment, the A and C ports do not include ground pads 64, resulting in a reduction in the total number of ground pads.

It should be noted that although the above semiconductor device of the present embodiment includes an SP3T switch, the present embodiment may be applied to other "odd type" SPnT switches such as SP5T and SP7T switches. Specifically, in these SPnT switches, too, the connection ports of the straight path may include both a signal pad and ground pads (i.e., have the same configuration as the above high frequency characteristics measurement pads 60), and the other connection ports (i.e., the connection ports of the bent paths) may include only a signal pad. That is, the above aspect of the present embodiment can be applied to any semiconductor device having a configuration in which the transmission line includes a straight path and a plurality of branch paths that symmetrically extend from the straight path.

(Semiconductor Devices Including "Even Type" SPnT Switch Circuit Device)

Figure 6:
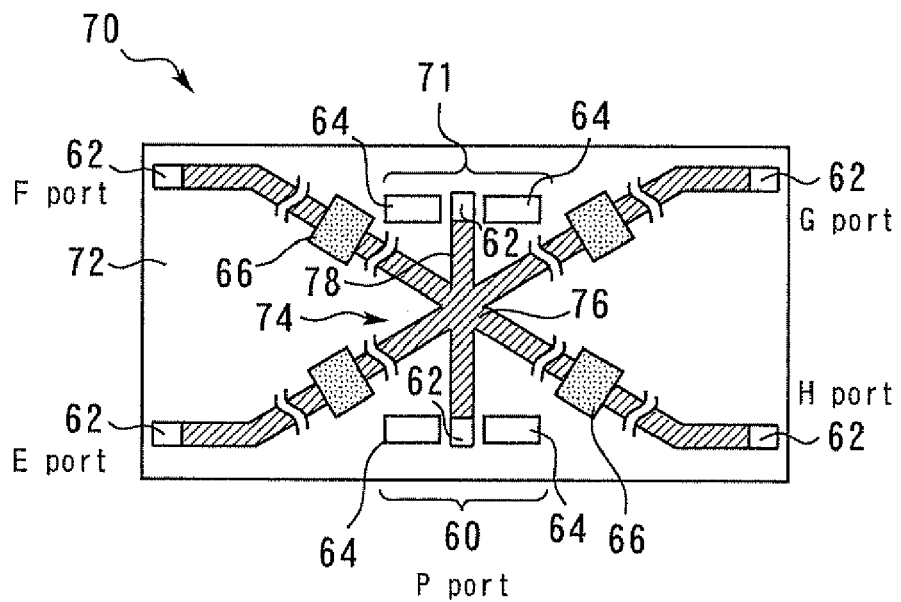
FIG. 6 is a diagram showing the configuration of a SP4T switch circuit device according to the first embodiment.

FIG. 6 is a schematic diagram showing the configuration (or the circuit configuration on the surface) of a semiconductor device 70 including an "even type" SPnT switch circuit device according to the present embodiment. The semiconductor device 70 is an SP4T switch having P, E, F, C, and H ports. In the semiconductor device 70, a transmission line 74 forms an SP4T switch circuit device. As shown in FIG. 6, the P port includes both a signal pad 62 and ground pads 64. The E, F, G, and H ports, on the other hand, do not include ground pads 64, though they include a signal pad 62.

Referring to FIG. 6, reference numeral 76 denotes an intermediate node, or branch node, 76 from which branches extend to ports. Reference numeral 78 denotes an inspection transmission line extending from the branch node 76 away from the P port. A high frequency characteristics measurement pad 71 is provided at the end of the inspection transmission line 78. The high frequency characteristics measurement pad 71 includes the same components as the high frequency characteristics measurement pad 60.

Conventional "even type" SPnT switches do not include a straight path, since they have one primary, or reference, port (e.g., in the present embodiment, the P port) and an even number of connection ports. The semiconductor device 70, on the other hand, includes a path made up of the transmission line 74 and the inspection transmission line 78. This allows the inspection method of the present embodiment to be applied to the semiconductor device 70, which includes an SP4T switch (an "even type" SPnT switch).

It should be noted that although the above semiconductor device (70) is an SP4T switch, other "even type" SPnT switches (such as SP6T, SP8T, and SP10T switches) may be provided with the inspection transmission line 78, with the same effect.

In the semiconductor device 70, the P, E, F, G, and H ports are used as connection ports, but the high frequency characteristics measurement pad 71 of the inspection transmission line 78 is not used as a connection port. Therefore, the high frequency characteristics measurement pad 71 may be spaced a smaller distance from the periphery of the substrate 72 than the other ports.

In the semiconductor device 70, the signal pads 62 of the connection ports (i.e., the P, E, F, G, and H ports) are substantially equally spaced from the periphery of the substrate 72 to achieve better performance. However, the high frequency characteristics measurement pad 71 need not be spaced in the same manner as these signal pads 62. Therefore, the high frequency characteristics measurement pad 71 may be spaced a smaller distance from the branch node 76 (i.e., a larger distance from the periphery of the substrate 72) than the signal pad 62 of the P port to reduce the length of the inspection transmission line 78.

Figure 7:
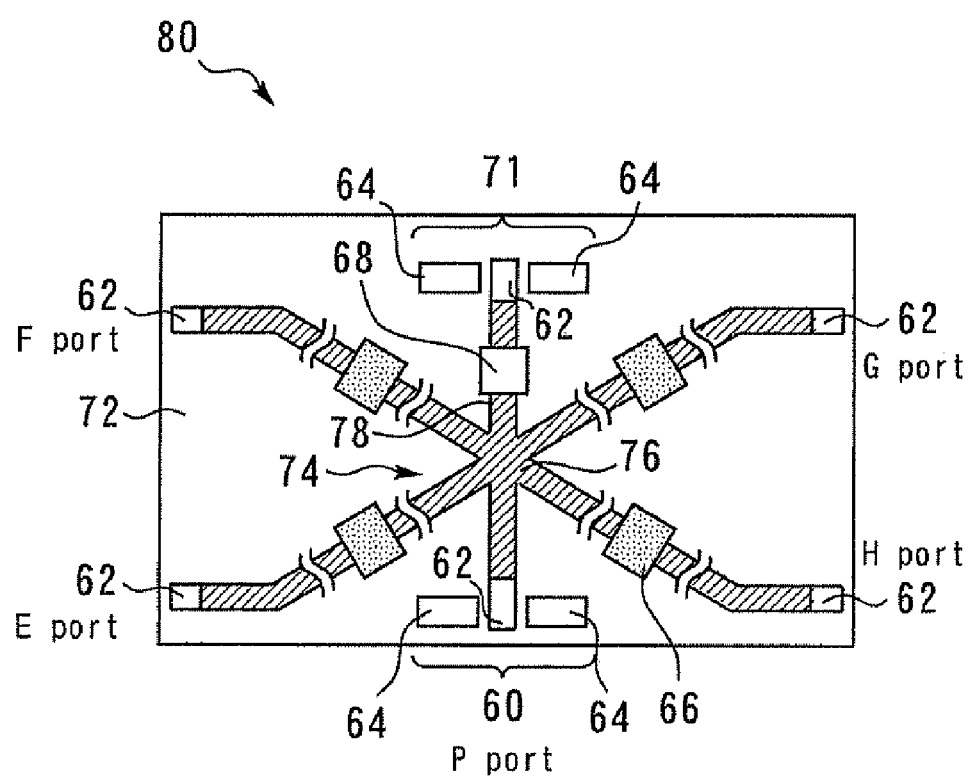
FIG. 7 is a diagram showing the configuration of a SP4T switch circuit device according to the first embodiment.

FIG. 7 is a diagram showing the circuit configuration on the surface of a semiconductor device 80 which is a variation of the semiconductor device 70 shown in FIG. 6. The semiconductor device 80 differs the semiconductor device 70 in that it additionally includes an active element 68 connected to the inspection transmission line 78 at an intermediate point. The active element 68 can cut off the flow of electricity through the inspection transmission line 78 at a position a predetermined distance from the branch node 76. More specifically, this predetermined distance is equal to one-quarter of the wavelength (or wavelength band) at which the semiconductor device 80 is actually used as a switch.

According to the present embodiment, when the semiconductor device 80 is actually used as a switch, a control signal is applied to the active element 68 to cut off conduction through the inspection transmission line 78 and thereby prevent the inspection transmission line 78 and the high frequency characteristics measurement pad 71 from acting as stubs. This prevents degradation of the high frequency characteristics. It should be noted that although the above semiconductor device (80) includes an SP4T switch, other "even type" SPnT switches (such as SP6T and SP8T switches) may be used instead, with the same effect.

Although the above semiconductor devices 10, 50, 70, and 80 are suitable for the inspection method of the present embodiment, the method can be applied to other semiconductor devices. For example, it may be used to inspect the semiconductor device 600 described in connection with the conventional inspection method. The inspection method of the present embodiment can be used to inspect any semiconductor device whose transmission line includes a primary (or reference) transmission line portion and a plurality of branch transmission line portions branching off from the primary transmission line portion. It should be further noted that although the inspection method of the present embodiment has been described as comparing both measured transmission characteristics and measured reflection characteristics of the straight path (or the transmission line), it may compare only either transmission or reflection characteristics.

The above exemplary semiconductor devices have been described as including FETs as their active elements. However, they may include other known active elements instead of FETs. Further, although these semiconductor devices have been described as including a microstrip transmission line as their transmission line, they may include a coplanar transmission line, etc. instead of a microstrip transmission line.

Second Embodiment

Inspection Method of Second Embodiment

Figure 8:
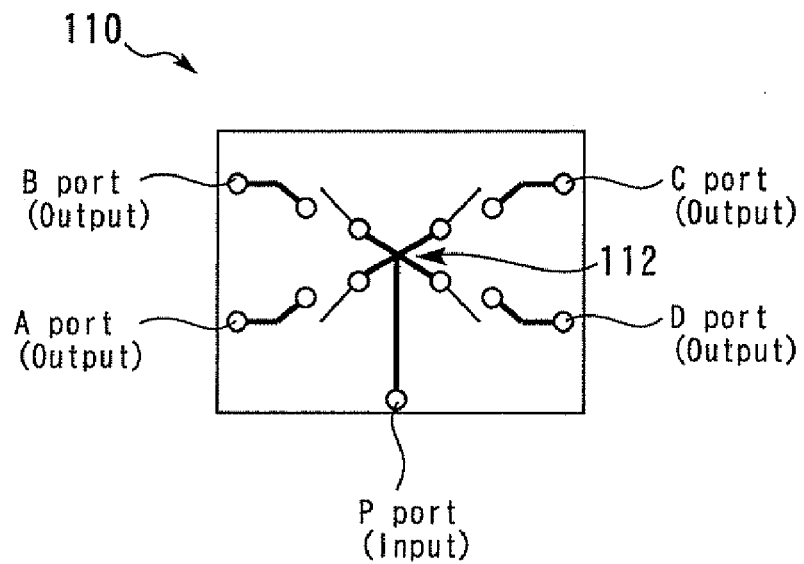
FIG. 8 is a diagram showing a semiconductor device in connection with which an inspection method of a second embodiment will be described.
Figure 9:
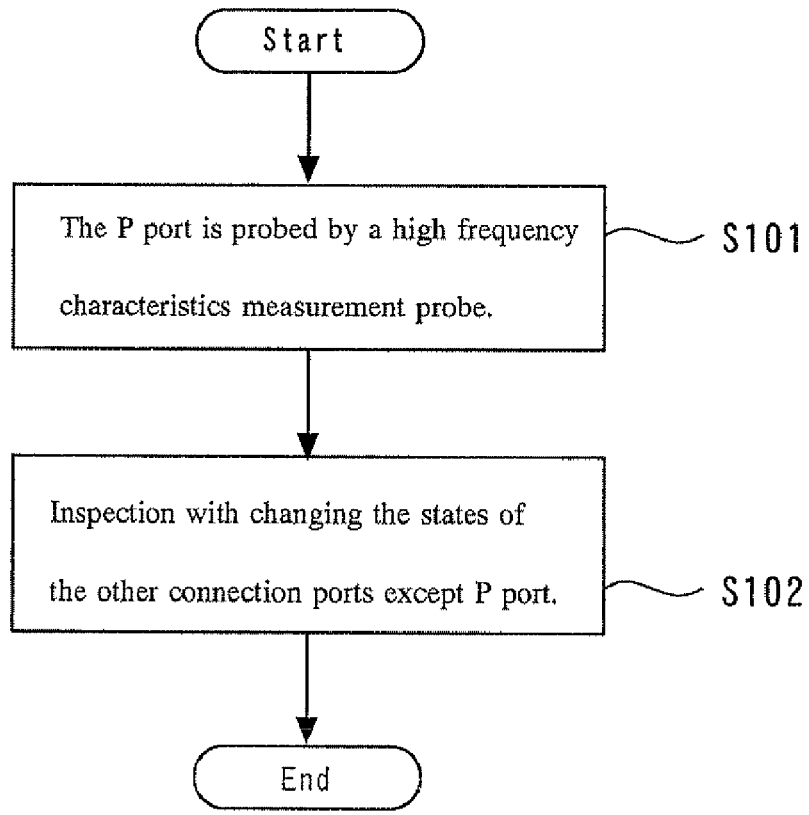
FIG. 9 is a flowchart illustrating the inspection method of the second embodiment.

FIG. 8 is a diagram showing a semiconductor device 110 in connection with which an inspection method of a second embodiment of the present invention will be described. The semiconductor device 110 includes an SP4T switch circuit device 112. FIG. 9 is a flowchart illustrating the inspection method of the second embodiment.

The inspection method of the first embodiment measures the transmission characteristics of the straight path between two ports (in the third and fourth states) by use of two high frequency characteristics measuring probes and compares the measurement results to determine whether the bent paths are defective. The inspection method of the present embodiment differs from that of the first embodiment in that it measures the reflection characteristics of the straight path by use of a single high frequency characteristics measuring probe and determines whether the bent paths are defective based on the measurement results.

The inspection method of the present embodiment measures high frequency characteristics of a switch in the following manner. First, the P port is probed by a high frequency characteristics measurement probe (step S101 of FIG. 9) to measure the high frequency reflection characteristics of the P port. At that time, the branch path (or bent path) connected to one of the A to D ports, for example, the A port, is turned on and the other branch paths are turned off. Next, the branch path connected to the D port (which is symmetrical to the A port with respect to a straight line drawn through both the P port and the branch node) is turned on, and the other branch paths are turned off. The reflection characteristics are then measured again. These two measurements are compared to determine whether the branch paths are defective (step S102). The inspection method then performs measurements on the branch paths connected to the B and C ports in the same manner as it did on the branch paths connected to the A and D ports, and compares the results.

As described above, the inspection method of the present embodiment measures only the reflection characteristics of the transmission line (in the third and fourth states) and compares the measurement results. Specifically, it turns on the branch path connected to the A port, turns off the other branch paths, and then measures the reflection characteristics of the transmission line to obtain a first measured value. Next, the method turns on the branch path connected to the D port, turns off the other branch paths, and then measures the same characteristics to obtain a second measured value. These two measured values are compared to determine whether the branch paths are defective. This inspection method is used to inspect "even type" SPnT switches, whose transmission line does not include a straight path extending straight between two ports.

The inspection method then performs measurements on the branch paths connected to the B and C ports in the same manner as described above. That is, the method turns on the branch path connected to the B port, turns off the other branch paths, and then measures the reflection characteristics of the transmission line to obtain a measured value. Next, the method turns on the branch path connected to the C port, turns off the other branch paths, and then measures the same characteristics to obtain another measured value. These two measured values are compared to determine whether the branch paths are defective. In this way, it is possible to quickly measure the high frequency (switch) characteristics of the branch path connected to each port. It should be noted that although the inspection method of the present embodiment has been described in connection with an SP4T switch, the method may be used to inspect other switches (such as SP2T and SP6T switches, etc.) by appropriately turning on and off the branch paths connected to their ports and comparing the measured high frequency characteristics of the transmission line.

It should be noted that when the reflection characteristics of the transmission line are measured, a plurality of branch paths may be simultaneously turned on instead of just one to check these branch paths at once. This allows one to detect, with a reduced number of measurement operations and hence reduced measurement time, whether each of the n number of branch paths (or connection ports) is defective. Specifically, first, the reflection characteristics of the transmission line are measured when the branch paths connected to the A and B ports are turned on and the other branch paths are turned off. Next, the same characteristics are measured when the branch paths connected to the C and D ports are turned on and the other branch paths are turned off. These two measured values are then compared to determine whether the branch paths (or ports) are defective.

The inspection method of the present embodiment also allows one to omit probing connection ports other than the P port.

[Semiconductor Device of Second Embodiment]

Figure 10:
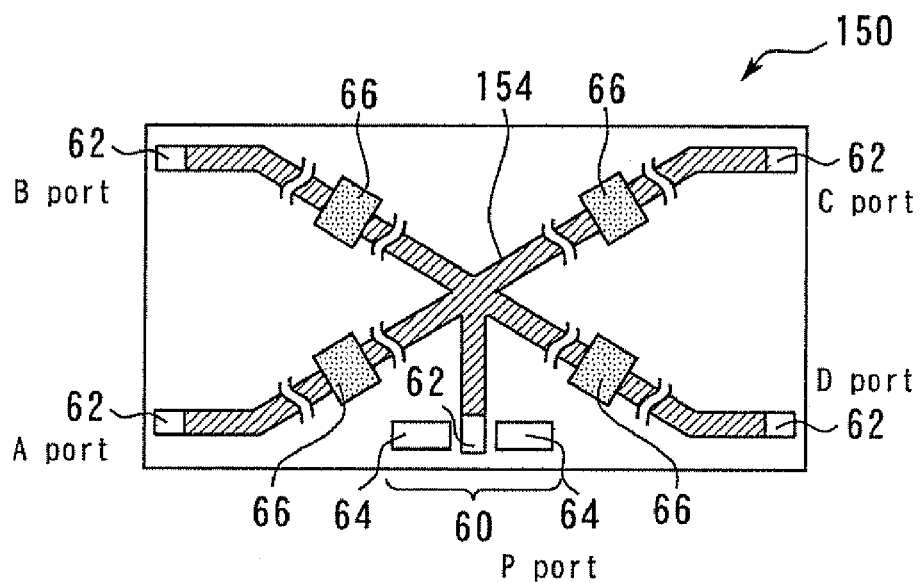
FIG. 10 is a diagram illustrating a semiconductor device suitable for the inspection method of the second embodiment.

FIG. 10 is a diagram illustrating a semiconductor device suitable for the inspection method of the present embodiment. Specifically, FIG. 10 is a schematic diagram showing the circuit configuration on the surface of a semiconductor device 150. The semiconductor device 150 includes a transmission line 154 and signal pads 62 connected to the transmission line 154. Active elements 66 are also connected to the transmission line 154 at intermediate points. The transmission line 154, the signal pads 62, and the active elements 66 form an SP4T switch circuit device. The P port includes both a signal pad 62 and ground pads 64. The A, B, C, and D ports, on the other hand, do not include ground pads 64, though they include a signal pad 62.

As described above, the inspection method of the present embodiment allows one to omit probing connection ports other than the P port. This means that the A, B, C, and D ports do not require ground pads which are to be contacted by a ground potential probe needle. Therefore, in the semiconductor device of the present embodiment, the A, B, C, and D ports do not include ground pads 64, resulting in a reduction in the total number of ground pads.

It should be noted that although the above semiconductor device includes an SP4T switch, other "even type" SPnT switches (such as SP2T and SP6T switches) may be used instead, with the same effect. Further, although the above semiconductor device 150 is suitable for the inspection of the present embodiment, the method can be applied to other semiconductor devices. That is, the inspection method of the present embodiment can also be used to inspect "even type" SPnT switches in which the P port and other connection ports both include ground potential pads.

Third Embodiment

Inspection Method and Semiconductor Devices of Third Embodiment

Figure 11:
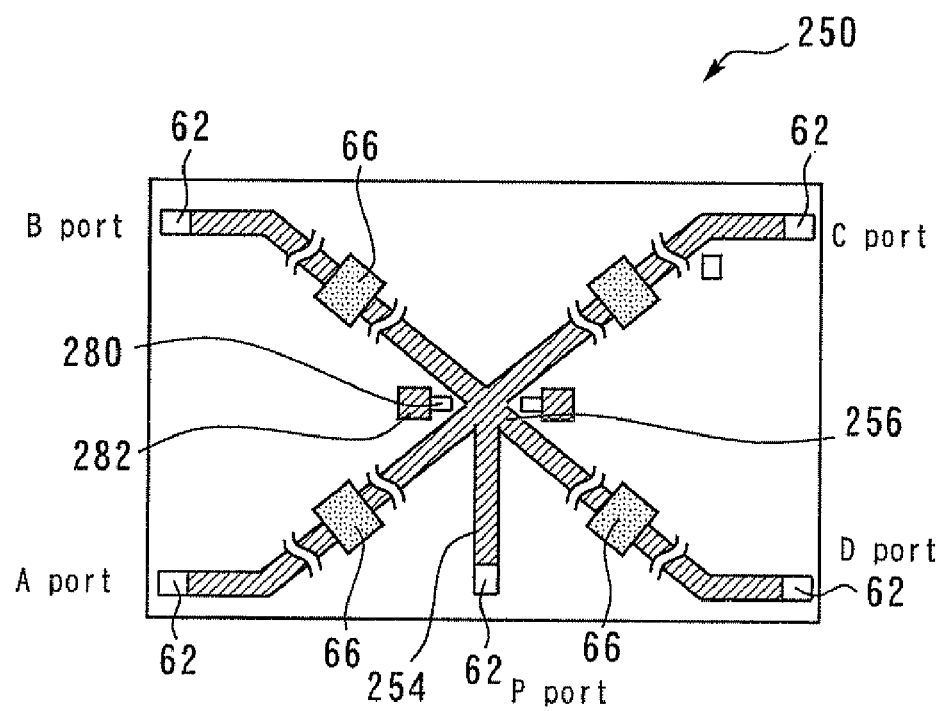
FIG. 11 is a schematic diagram showing the circuit configuration on the surface of a semiconductor device (a SP4T switch) to explain an inspection method of a third embodiment.

FIG. 11 is a schematic diagram showing the circuit configuration on the surface of a semiconductor device (250) suitable for an inspection method of a third embodiment of the present invention. As shown in FIG. 11, the semiconductor device 250 is an SP4T switch having P, A, B, C, and D ports. The semiconductor device 250 differs from the semiconductor device 150 shown in FIG. 10 in that its P port does not include the ground pads 64, and instead ground pads and via holes are disposed near the branch node of the transmission line.

The inspection methods of the first and second embodiments have been described with reference to the schematic circuit diagrams shown in FIGS. 1 and 8, respectively, and semiconductor devices suitable for these inspection methods have been described with reference to FIGS. 5, 6, 7, etc., which illustrate the circuit configuration on the surface of each semiconductor device. On the other hand, FIG. 11 will be only used to describe both the inspection method of the third embodiment and the circuit configuration on the surface of a semiconductor device suitable for this inspection method.

The semiconductor device 250 includes the following components near the branch node 256 of its transmission line 254. Referring to FIG. 11, reference numeral 280 denotes ground potential pads, and 282 denotes conductive through-holes called "via holes." Each conductive through-hole 282 is made up of a through-hole extending from the top surface to the bottom surface of the semiconductor device 250, and gold plating formed on the inner surface of the through-hole. The branch node 256 and the two ground pads 280 are arranged in a straight line.

In the inspection method of the present embodiment, a high frequency characteristics measuring probe is brought into contact with the branch node 256 and the ground pads 280 (when measuring high frequency characteristics of the transmission line). That is, in this method, the branch node 256 and the ground pads 280 together provide the function of the P port described in connection with the inspection methods of the first and second embodiments.

The inspection method of the present embodiment measures characteristics of such a semiconductor device by using a symmetrical arrangement of the components with respect to the straight line drawn through both the branch node 256 and the P port. The method first turns on the branch path connected to, for example, the A port, turns off the other branch paths, and measures the reflection characteristics of the transmission line to obtain a first measured value.

Next, the method turns on the branch path connected to the D port, turns off the other branch paths, and then measures the same characteristics to obtain a second measured value. These two measured values are compared to determine whether the A and D ports (and the branch paths connected thereto) are defective. This allows one to reduce the inspection time, as in the first and second embodiments.

It should be noted that although the above semiconductor device includes an SP4T, other SPnT switches (such as SP2T and SP6T switches) may be used instead. In the semiconductor device 250, none of the five connection ports includes ground pads 64. However, the inspection method of the present embodiment can be applied to semiconductor devices having other configurations. For example, the method may be used to inspect a variation of the semiconductor device 600 (described in connection with the conventional inspection method) in which ground pads 280 and conductive through-holes 282 are provided near the branch node of the transmission line. Further, the method can also be applied to a semiconductor device with a plurality of pairs of bent paths (or branch paths) in which the part of the bent paths do not include ground pads 64, and the rest of the bent paths include ground pads 64.

Figure 12:
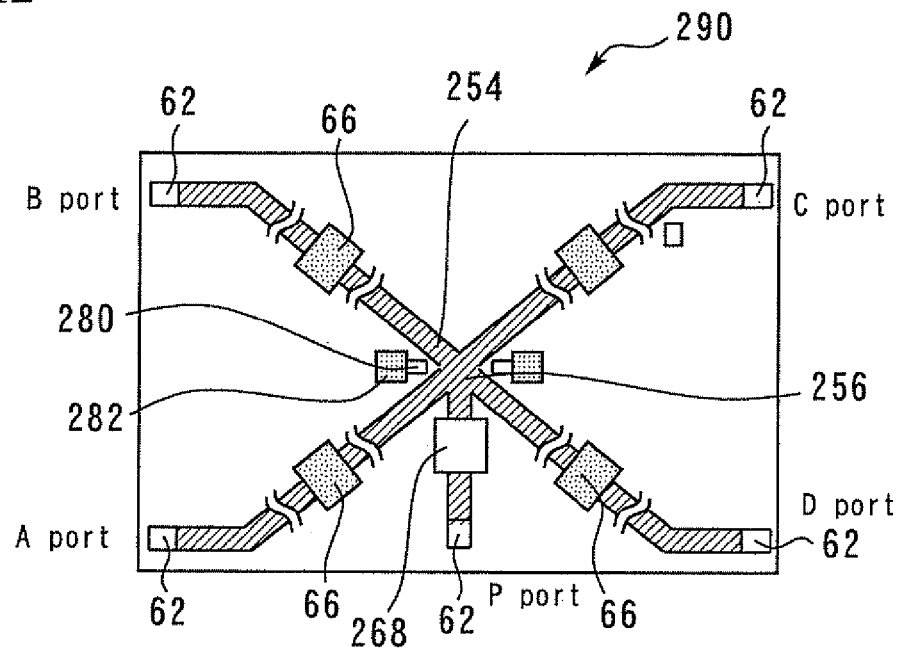
FIG. 12 is a diagram showing the configuration of a SP4T switch circuit device according to the third embodiment.

FIG. 12 is a diagram showing a semiconductor device 290 which is a variation of the semiconductor device 250. The semiconductor device 290 is similar to the semiconductor 250 except that it additionally includes an active element 268 connected to the transmission line at an intermediate point between the P port and the branch node. With this arrangement, when characteristics of the transmission line are measured, a control signal may be applied to the active element 268 to electrically disconnect or isolate the P port portion from the transmission line and thereby prevent this portion from acting as a stub. This allows the high frequency characteristics of the transmission line to be accurately measured.

Figure 13:
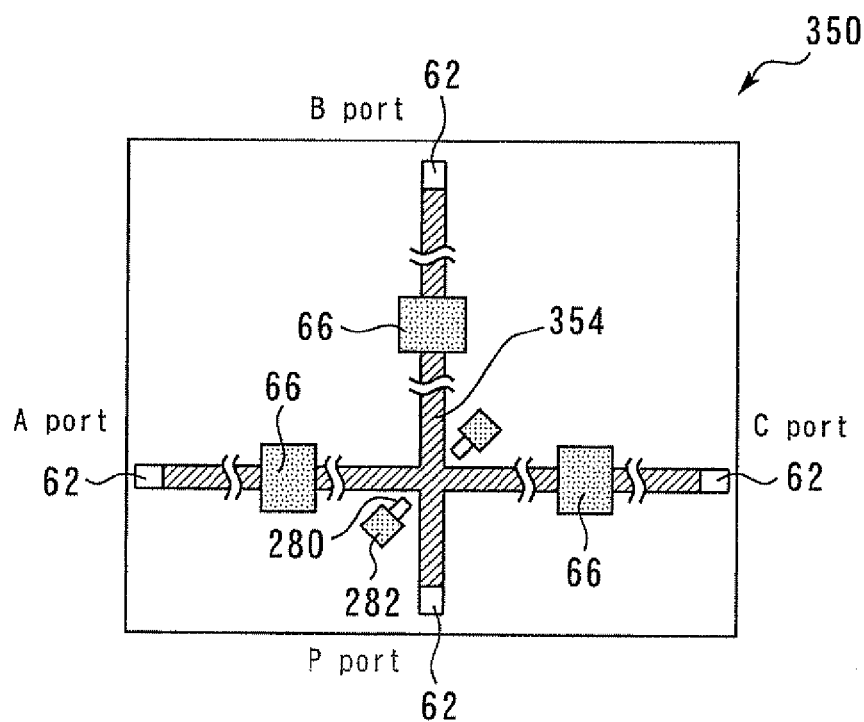
FIG. 13 is a diagram showing a semiconductor device (a SP3T switch) according to the third embodiment.
Figure 14:
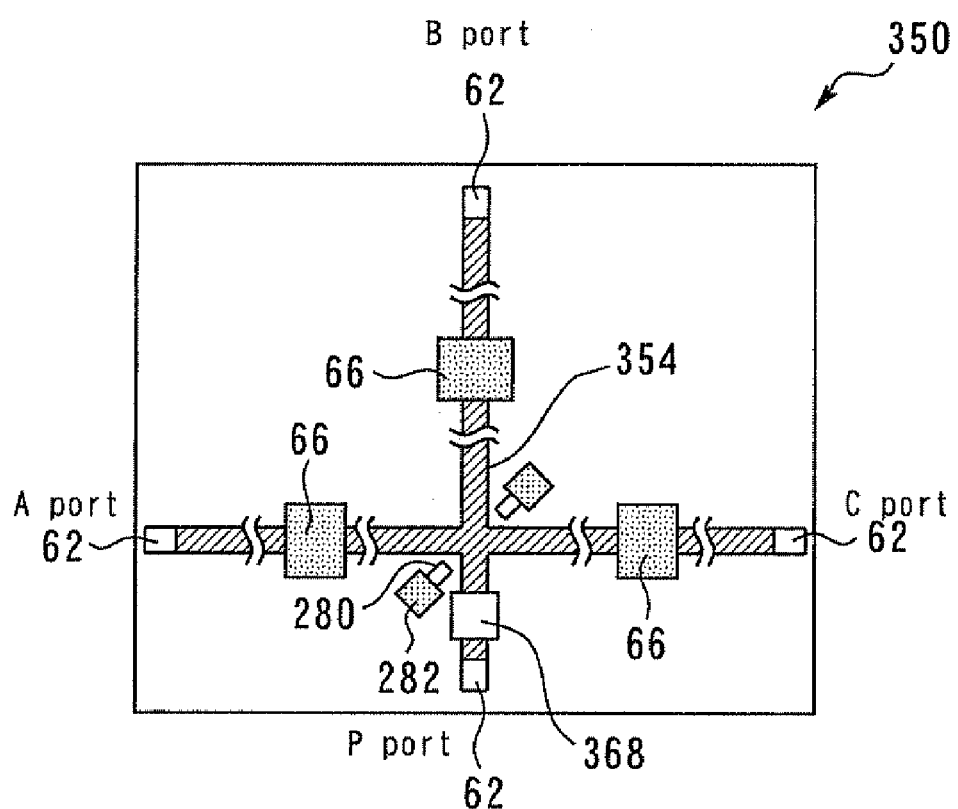
FIG. 14 is a diagram showing a variation of the semiconductor device (a SP3T switch) according to the third embodiment.

It should be noted that the idea of the present embodiment described above can also be applied to "odd type" SPnT switches. FIG. 13 is a diagram showing a semiconductor device 350 including an SP3T switch device according to the present embodiment. In this semiconductor device, ground pads 280 and conductive through-holes 282 are provided near the branch node of the transmission line (354), as shown in FIG. 13. Further, FIG. 14 is a diagram showing a variation of the semiconductor device 350 in which an active element 368 is provided to prevent the P port portion from acting as a stub. Thus, the idea of the present embodiment can be applied to "odd type" SPnT switches.

Fourth Embodiment

Semiconductor Device of Fourth Embodiment

Figure 15:
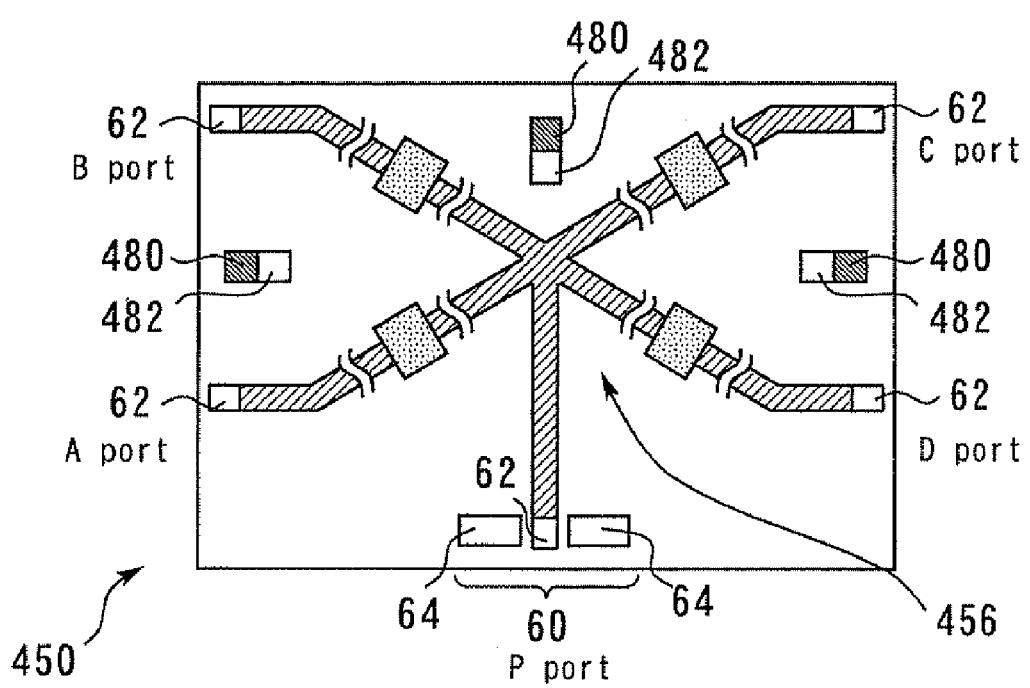
FIG. 15 is a diagram illustrating the circuit configuration on the surface of a semiconductor device (a SP4T switch) of a fourth embodiment.

A fourth embodiment of the present invention is applied to the semiconductor devices of the first to third embodiments described above to prevent a reduction of the isolation between the connection ports. FIG. 15 is a diagram illustrating the circuit configuration on the surface of a semiconductor device 450 of the present embodiment. As shown in FIG. 15, the semiconductor device 450 is an SP4T switch in which a transmission line 456, a P port, and other four connection ports are provided on the surface of the substrate.

In the above semiconductor devices of the first and second embodiments, connection ports other than the P port do not include ground pads. Further, in the above semiconductor devices of the third embodiment, even the P port does not include ground pads, and instead ground pads are provided near the branch node. These configurations might result in degraded isolation between channels (or ports). To prevent this, the semiconductor device 450 of the present embodiment includes isolating ground pads 480, as shown in FIG. 15.

Each isolating ground pad 480 is electrically coupled to the bottom surface of the semiconductor device 450 through a conductive through-hole 482, thereby preventing degradation of the isolation between the ports. It should be noted that each isolating ground pad 480 is disposed between two adjacent connection ports, as shown in FIG. 15. Specifically, in FIG. 15, each isolating ground pad 480 is disposed between two adjacent connection ports that do not include ground pads 64. These isolating ground pads 480 are symmetrically arranged with respect to the branch node of the transmission line. However, each isolating ground pad 480 need not necessarily be equally spaced from the two adjacent connection ports as in FIG. 15; it only need be sandwiched between two connection ports.

The following should be noted: the A, B, C, and D ports, etc. of the above embodiments will be referred to in the summary of the invention as "connection ports"; the P port, a "primary connection port"; the transmission lines 54, 154, 254, 354, and 454, "transmission lines"; the straight path, a "primary transmission line portion"; the bent paths, "branch transmission line portions"; the signal pads 62, "signal pads"; the ground pads 64, "ground pads"; and the high frequency characteristics measuring probes, "inspection probes."

The inspection methods of the above embodiments measure the high frequency transmission characteristics and high frequency reflection characteristics of the transmission line (or straight path) in the third and fourth states (described above in connection with the first embodiment) and compare these two measurements to determine whether the (bent) paths are defective (It also should be noted that the "third state" in the above embodiments corresponds to the "first circuit state" in the summary of the invention, and that the "fourth state" in the above embodiments corresponds to the "second circuit state" in the summary of the invention). However, the present invention is not limited to this. In other embodiments, other characteristics of the transmission line (or straight path), which exhibit substantially identical in the third and fourth states in normal states, may be measured to determine whether the bent paths (which are symmetrically arranged with respect to the straight path) are defective. Further, the inspection methods of the above embodiments determine that the semiconductor device is in its normal state if the transmission line exhibits substantially identical characteristics in the third and fourth states. However, the present invention is not limited to this. In other embodiments, the semiconductor device may be determined to be in its normal state if characteristics of the transmission line in these states differ by less than a predetermined amount.

According to the present invention, the following method may be used to inspect "odd type" SPnT switches such as SP5T and SP7T switches. (This method will be described in connection with the SP5T switch shown in FIG. 16.)

In the SP5T switch shown in FIG. 16, a straight path extends between P and C ports. Further, A and E ports (and the bent paths connected thereto) are symmetrically arranged with respect to the straight path, and so are B and D ports (and bent paths connected thereto). The A and B ports are disposed on one side of the straight path, and the B and D ports are disposed on the other side of the straight path.

Figure 16A:
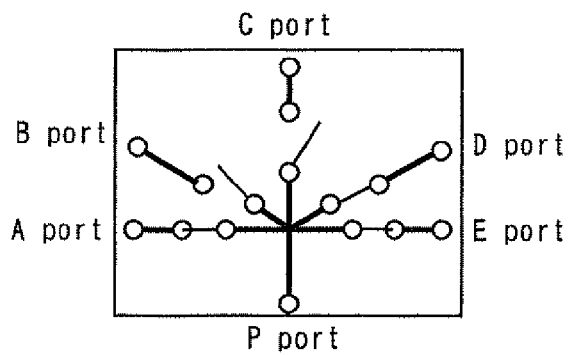
FIG. 16 is a schematic diagram showing the circuit configuration on the surface of a semiconductor device (a SP5T switch) to explain an inspection method of a variation of the present invention.
Figure 16B:
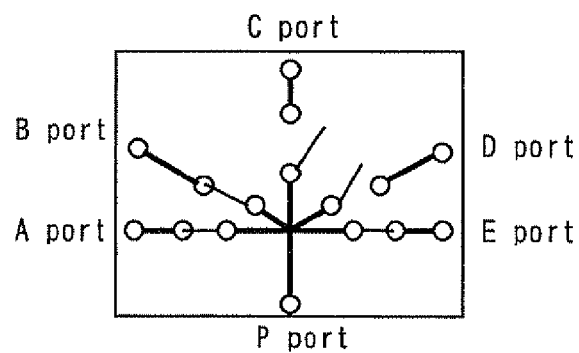

This inspection method first inspects the straight path, as with the inspection method of the first embodiment. Next, the method disconnects the C port from the transmission line, turns off the bent path connected to the B port, turns on the other bent paths, and then measures the reflection characteristics of the transmission line (or straight path) to obtain a first measured value, as shown in FIG. 16A. The method then turns off the bent path connected to the D port, turns on the other bent paths, and measures the same characteristics to obtain a second measured value, as shown in FIG. 16B. That is, the first measurement is made when the B and D ports (which are symmetrically arranged with respect to the straight path) are turned off and turned on, respectively, and the second measurement is made when the B and D ports are turned on and turned off, respectively. These two measured values may be compared to determine characteristics of the transmission line.

That is, this inspection method measures the reflection characteristics of the transmission line in a circuit state in which at least one of the plurality of bent paths is turned on and at least one of the other bent paths is turned off (hereinafter also referred to simply as a "first circuit state") to obtain a first measured value. The method then measures the same characteristics in a circuit state in which the at least one of the plurality of bent paths is turned off and the at least one of the other bent paths is turned on (hereinafter also referred to simply as a "second circuit state") to obtain a second measured value. (The second circuit state is a mirror image of the first circuit state.) These two measured values may be compared to determine characteristics of the transmission line. This idea can also be applied to inspection of other "odd type" SPnT switches such as SP9T, SP11T, and SP13T switches.

Figure 17A:
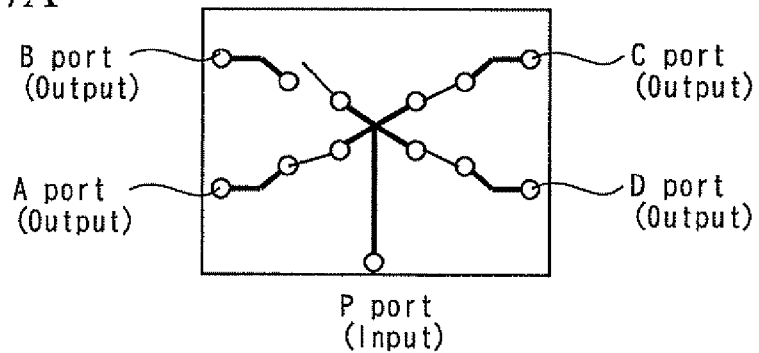
FIG. 17 is a schematic diagram showing the circuit configuration on the surface of a semiconductor device (a SP5T switch) to explain an inspection method of other variation of the present invention.
Figure 17B:
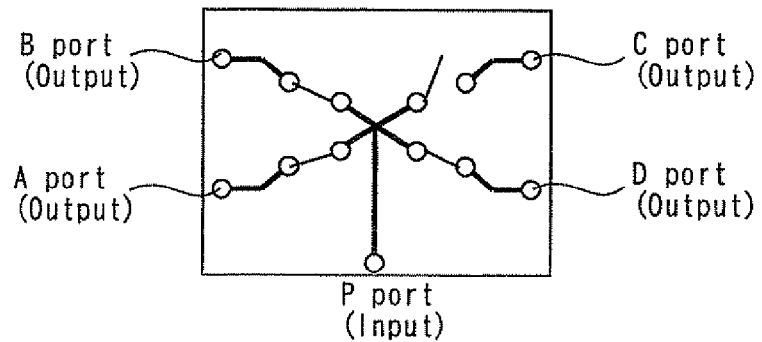

It should be noted that the above inspection method can be adapted to inspect "even type" SPnT switches such as SP4T switches, as shown in FIGS. 17A and 17B.

The features and advantages of the present invention may be summarized as follows:

The one aspect (aspect 1) of the present invention allows one to determine whether two branch transmission line portions of the transmission line are defective by comparing two measurements. This simplifies the inspection process and results in a reduction in the number of times the measuring system is reset and calibrated.

The another aspect (aspect 2) of the present invention allows one to determine whether two branch transmission line portions of the transmission line are defective by comparing two measurements. This simplifies the inspection process and results in a reduction in the number of times the measuring system is reset and calibrated.

The another aspect (aspect 3) of the present invention allows one to determine whether two branch transmission line portions of the transmission line are defective by comparing two measurements. This simplifies the inspection process and results in a reduction in the number of times the measuring system is reset and calibrated.

The semiconductor device of the another aspect (aspect 4) of the invention is suitable for the inspection methods of the aspect 1 and 2 and has a reduced number of ground pads.

Further, the semiconductor device of the another aspect (aspect 5) of the invention is suitable for the inspection method of the aspect 3 and has a reduced number of ground pads.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-099380, filed on Apr. 5, 2007 including specification, claims, drawings and summary, on which the Convention priority of the present application is based, are incorporated herein by reference in its entirety.

The invention claimed is:

1. A method for inspecting a semiconductor device, wherein said semiconductor device includes
    a primary connection port, which includes a signal pad and a ground pad,
    a transmission line, comprising
        a primary transmission line portion including a branch node and connected to said primary connection port,
        a plurality of branch transmission line portions extending symmetrically from said branch node with respect to said primary transmission line portion and a straight line extension of said primary transmission line portion, and
        a straight branch transmission line portion extending on the straight line portion extending on the straight line extension of said primary transmission line portion,
    connection ports, which are symmetrically arranged with respect to said primary transmission line portion and the straight line extension of said primary transmission line portion, each connection port being connected to a respective one of said branch transmission line portions and said straight branch transmission line portion, and including at least one signal pad, and
    active elements, wherein each active element is connected to a respective one of said branch transmission line portions and said straight branch transmission line portion and for establishing and preventing electrical conduction through said respective one of said branch transmission line portions and said straight branch transmission line portion,
    the method comprising:
    establishing a first circuit state in which electrical conduction through at least a first of said plurality of branch transmission line portions is established, electrical conduction through at least a second of said branch transmission line portions is prevented, and electrical conduction is established from said primary connection port through said primary transmission line portion and said straight branch transmission line and measuring electrical signal reflection characteristics of said transmission line at said primary connection port to obtain a first measured value;
    establishing a second circuit state in which electrical conduction through at least a third of said branch transmission line portions is prevented, electrical conduction through said at least the second of said branch transmission line portions is established, and electrical conduction is established from said primary connection port through said primary transmission line portion and said straight branch transmission line, and measuring said electrical signal reflection characteristics of said transmission line at said primary connection port to obtain a second measured value, wherein the second circuit state is a mirror image of the first circuit state with respect to said primary transmission line portion and the straight line extension of said primary transmission line portion; and
    after obtaining only the first and second measured values, comparing the first and second measured values to determine characteristics of said transmission line.

2. The method according to claim 1, wherein obtaining the first measured value and obtaining the second measured value include measuring the electrical signal reflection characteristics by contacting an inspection probe with said primary connection port.

3. A method for inspecting a semiconductor device, wherein said semiconductor device includes
   a primary connection port, which includes a signal pad and a ground pad,
   a transmission line comprising
      a primary transmission line portion including a branch node and connected to said primary connection port, and
      a plurality of branch transmission line portions extending symmetrically from said branch node with respect to said primary transmission line portion and a straight line extension of said primary transmission line portion,
   connection ports, which are symmetrically arranged with respect to said primary transmission line portion and the straight line extension of said primary transmission line portion, each connection port being connected to a respective one of said branch transmission line portions, and including at least one signal pad, and
   active elements, wherein each active element is connected to a respective one of said branch transmission line portions and for establishing and preventing electrical conduction through said respective one of said branch transmission line portions,
   the method comprising:
   establishing a first circuit state in which electrical conduction through at least a first of said plurality of branch transmission line portions is established, electrical conduction through at least a second of said branch transmission line portions is prevented, and measuring electrical signal reflection characteristics of said transmission line at said primary connection port to obtain a first measured value;
   establishing a second circuit state in which electrical conduction through at least a third of said branch transmission line portions is prevented, electrical conduction through said at least the second of said branch transmission line portions is established, and measuring said electrical signal reflection characteristics of said transmission line at said primary connection port to obtain a second measured value, wherein the second circuit state is a mirror image of the first circuit state with respect to said primary transmission line portion and the straight line extension of said primary transmission line portion; and
   comparing the first and second measured values to determine characteristics of said transmission line, wherein
      obtaining the first measured value includes establishing electrical conduction through said branch transmission line portions disposed at a first side of said primary transmission line portion and the straight line extension of said primary transmission line portion, preventing electrical conduction through said branch transmission line portions disposed at a second side of said primary transmission line portion and the straight line extension of said primary transmission line portion, and measuring the electrical signal reflection characteristics of said transmission line at said primary connection port to obtain a third measured value;
      obtaining the second measured value includes preventing electrical conduction through said branch transmission line portions disposed at the first side of said primary transmission line portion and the straight line extension of said primary transmission line portion, establishing electrical conduction through said branch transmission line portions disposed at the second side of said primary transmission line portion and the straight line extension of said primary transmission line portion, and measuring the electrical signal reflection characteristics of said transmission line at said primary connection port to obtain a fourth measured value; and
      comparing the first and second measured values to determine the characteristics of said transmission line includes comparing the third and fourth measured values to determine the characteristics of said transmission line.

4. A method for inspecting a semiconductor device,
   a primary connection port, which includes a signal pad and a ground pad,
   a transmission line comprising
      a primary transmission line portion including a branch node and connected to said primary connection port, and
      a plurality of branch transmission line portions extending symmetrically from said branch node with respect to said primary transmission line portion and a straight line extension of said primary transmission line portion,
   connection ports, which are symmetrically arranged with respect to said primary transmission line portion and the straight line extension of said primary transmission line portion, each connection port being connected to a respective one of said branch transmission line portions and including at least one signal pad, and
   active elements, wherein each active element is connected to a respective one of said branch transmission line portions and for establishing and preventing electrical conduction through said respective one of said branch transmission line portions,
   the method comprising:
   establishing a first circuit state in which electrical conduction through at least a first of said plurality of branch transmission line portions is established, electrical conduction through at least a second of said branch transmission line portions is prevented, and measuring electrical signal reflection characteristics of said transmission line at said primary connection port to obtain a first measured value;
   establishing a second circuit state in which electrical conduction through at least a third of said branch transmission line portions is prevented, electrical conduction through said at least the second of said branch transmission line portions is established, and measuring said electrical signal reflection characteristics of said transmission line at said primary connection port to obtain a second measured value, wherein the second circuit state is a mirror image of the first circuit state with respect to said primary transmission line portion and the straight line extension of said primary transmission line portion; and
   comparing the first and second measured values to determine characteristics of said transmission line, wherein said semiconductor device further includes a sub-primary connection port that includes a signal pad and a ground pad and that is disposed on an opposite side of said branch node relative to said primary connection port, and the method further comprises:
   establishing, by use of said active elements, a third circuit state in which electrical conduction through at least one of said branch transmission line portions is established and electrical conduction through at least one other branch transmission line portion is prevented, and measuring electrical signal transmission characteristics between said primary connection port and said sub-primary connection port to obtain a third measured value;

establishing, by use of said active elements, a fourth circuit state in which electrical conduction through said at least one of said branch transmission line portions is prevented and electrical conduction through said at least one other branch transmission line portion is established, the fourth circuit state being a mirror image of the third circuit state, and measuring the electrical signal transmission characteristics between said primary connection port and said sub-primary connection port to obtain a fourth measured value; and comparing the third and fourth measured values to determine characteristics of said transmission line.

5. The method according to claim 4, wherein obtaining the third measured value includes establishing electrical conduction through said branch transmission line portions disposed at a first side of said primary transmission line portion and the straight line extension of said primary transmission line, preventing electrical conduction through said branch transmission line portions disposed at a second side of said primary transmission line portion and the straight line extension of said primary transmission line, and measuring the electrical signal transmission characteristics between said primary connection port and said sub-primary connection port to obtain a fifth measured value;

obtaining the fourth measured value includes preventing electrical conduction through said branch transmission line portions disposed at the first side of said primary transmission line portion and the straight line extension of said primary transmission line portion, establishing electrical conduction through said branch transmission line portions disposed at the second side of said primary transmission line portion and the straight line extension of said primary transmission line portion, and measuring the electrical signal transmission characteristics between said primary connection port and said sub-primary connection port to obtain a sixth measured value; and comparing said third and fourth measured values to determine the characteristics of said transmission line includes comparing the fifth and sixth measured values to determine the characteristics of said transmission line.

6. The method according to claim 4, wherein obtaining the third measured value and obtaining the fourth measured value include measuring the electrical signal transmission characteristics by contacting a first inspection probe with said primary connection port and a second inspection probe with said sub-primary connection port.

* * * * *